United States Patent
Tabata et al.

(10) Patent No.: US 11,996,675 B2
(45) Date of Patent: May 28, 2024

(54) LASER DRIVE CIRCUIT AND SENSOR APPARATUS

(71) Applicant: SONY SEMICONDUCTOR SOLUTIONS CORPORATION, Kanagawa (JP)

(72) Inventors: Mitsushi Tabata, Kanagawa (JP); Takashi Masuda, Kanagawa (JP); Takeshi Yuwaki, Kanagawa (JP); Toshiyuki Kitazawa, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 711 days.

(21) Appl. No.: 17/250,309

(22) PCT Filed: Jun. 17, 2019

(86) PCT No.: PCT/JP2019/023980
§ 371 (c)(1),
(2) Date: Dec. 31, 2020

(87) PCT Pub. No.: WO2020/012880
PCT Pub. Date: Jan. 16, 2020

(65) Prior Publication Data
US 2021/0273404 A1    Sep. 2, 2021

(30) Foreign Application Priority Data
Jul. 10, 2018 (JP) .................. 2018-130713
Jul. 10, 2018 (JP) .................. 2018-130714

(51) Int. Cl.
*H01S 3/00*   (2006.01)
*H01S 5/042*  (2006.01)
*H01S 5/062*  (2006.01)

(52) U.S. Cl.
CPC ............ *H01S 5/0428* (2013.01); *H01S 5/042* (2013.01); *H01S 5/06226* (2013.01)

(58) Field of Classification Search
CPC ..... H01S 5/0428; H01S 5/042; H01S 5/06226
See application file for complete search history.

(56) References Cited

U.S. PATENT DOCUMENTS

| | | | |
|---|---|---|---|
| 6,618,406 B1* | 9/2003 | Kaminishi | H01S 5/042 |
| | | | 372/38.02 |
| 2002/0036630 A1* | 3/2002 | Sakura | H04B 10/508 |
| | | | 345/204 |

(Continued)

FOREIGN PATENT DOCUMENTS

| | | |
|---|---|---|
| CN | 101176215 A | 5/2008 |
| EP | 3297105 A1 | 3/2018 |

(Continued)

OTHER PUBLICATIONS

International Search Report and Written Opinion of PCT Application No. PCT/JP2019/023980, dated Sep. 10, 2019, 08 pages of ISRWO.

*Primary Examiner* — Kinam Park
(74) *Attorney, Agent, or Firm* — CHIP LAW GROUP

(57) ABSTRACT

A laser drive circuit is provided which includes: a first drive current unit (240) configured to adjust, by a first MOSFET (MN2) and a second MOSFET (MN3) being connected in series, an inflow of a current to a light-emitting element (LD11) that emits light in accordance with a current amount when the light-emitting element emits light and when the light-emitting element is extinguished; a voltage drop unit (MN4) configured to cause a gate-source voltage of the first MOSFET to drop when the light-emitting element is extinguished; and a timing generating unit (220) configured to (Continued)

generate a signal for controlling driving of the first drive current unit and the voltage drop unit.

6 Claims, 19 Drawing Sheets

(56) References Cited

U.S. PATENT DOCUMENTS

| | | | |
|---|---|---|---|
| 2009/0045758 A1 | 2/2009 | Chida | |
| 2013/0076266 A1* | 3/2013 | Dean | G11B 7/126 |
| | | | 327/108 |
| 2016/0211638 A1* | 7/2016 | Brownlee | H01S 5/042 |
| 2018/0083419 A1* | 3/2018 | Lee | H01S 5/042 |

FOREIGN PATENT DOCUMENTS

| | | |
|---|---|---|
| JP | 2002-101047 A | 4/2002 |
| JP | 2004-039748 A | 2/2004 |
| JP | 2006-339507 A | 12/2006 |
| JP | 2010-141138 A | 6/2010 |
| JP | 2014-232746 A | 12/2014 |
| WO | 2006/129597 A1 | 12/2006 |
| WO | 2010/067860 A | 6/2010 |

* cited by examiner

LASER DRIVE CIRCUIT AND SENSOR APPARATUS

CROSS REFERENCE TO RELATED APPLICATIONS

This application is a U.S. National Phase of International Patent Application No. PCT/JP2019/023980 filed on Jun. 17, 2019, which claims priority benefit of Japanese Patent Application No. JP 2018-130713 filed in the Japan Patent Office on Jul. 10, 2018 and Japanese Patent Application No. JP 2018-130714 filed in the Japan Patent Office on Jul. 10, 2018. Each of the above-referenced applications is hereby incorporated herein by reference in its entirety.

TECHNICAL FIELD

The present disclosure relates to a laser drive circuit and a sensor apparatus.

BACKGROUND ART

A technique related to a laser drive circuit for accelerating light emission driving of a light-emitting diode is described in, for example, PTL 1. An object of the technique described in PTL 1 is to accelerate a rise time and a fall time of an emission waveform of a light-emitting diode to accelerate light emission driving of the light-emitting diode.

CITATION LIST

Patent Literature

[PTL 1]
JP 2002-101047 A

SUMMARY

Technical Problem

However, application of laser apparatuses in the field of sensing and, in particular, to distance-measuring sensors is recently being promoted and there is a demand for further accelerating light emission driving of light-emitting elements such as light-emitting diodes. In particular, in laser apparatuses, there is room for improvement with respect to a fall time of an emission waveform of a light-emitting element. In consideration thereof, the present disclosure proposes a novel and improved laser drive circuit and sensor apparatus that are capable of accelerating light emission driving of a light-emitting element by particularly accelerating a fall time of an emission waveform of the light-emitting element.

Solution to Problem

According to the present disclosure, a laser drive circuit is provided which includes: a first drive current unit configured to adjust, by a first MOSFET and a second MOSFET being connected in series, an inflow of a current to a light-emitting element that emits light in accordance with a current amount when the light-emitting element emits light and when the light-emitting element is extinguished; a voltage drop unit configured to cause a gate-source voltage of the first MOSFET to drop when the light-emitting element is extinguished; and a timing generating unit configured to generate a signal for controlling driving of the first drive current unit and the voltage drop unit.

In addition, according to the present disclosure, a sensor apparatus is provided which includes: a light-emitting element configured to emit light in accordance with a current amount; a first drive current unit configured to adjust, by a first MOSFET and a second MOSFET being connected in series, an inflow of a current to the light-emitting element when the light-emitting element emits light and when the light-emitting element is extinguished; a voltage drop unit configured to cause a gate-source voltage of the first MOSFET to drop when the light-emitting element is extinguished; and a timing generating unit configured to generate a signal for controlling driving of the first drive current unit and the voltage drop unit.

Advantageous Effect of Invention

As described above, according to the present disclosure, a novel and improved laser drive circuit and sensor apparatus can be provided which are capable of accelerating light emission driving of a light-emitting element by particularly accelerating a fall time of an emission waveform of the light-emitting element.

It should be noted that the advantageous effect described above is not necessarily restrictive and, in addition to the advantageous effect described above or in place of the advantageous effect described above, any of the advantageous effects described in the present specification or other advantageous effects that can be comprehended from the present specification may be produced.

DESCRIPTION OF EMBODIMENTS

Hereinafter, preferred embodiments of the present disclosure will be described in detail with reference to the accompanying drawings. In the present specification and the drawings, components substantially having a same functional configuration will be denoted by same reference signs and overlapping descriptions thereof will be omitted.

Figure 1:
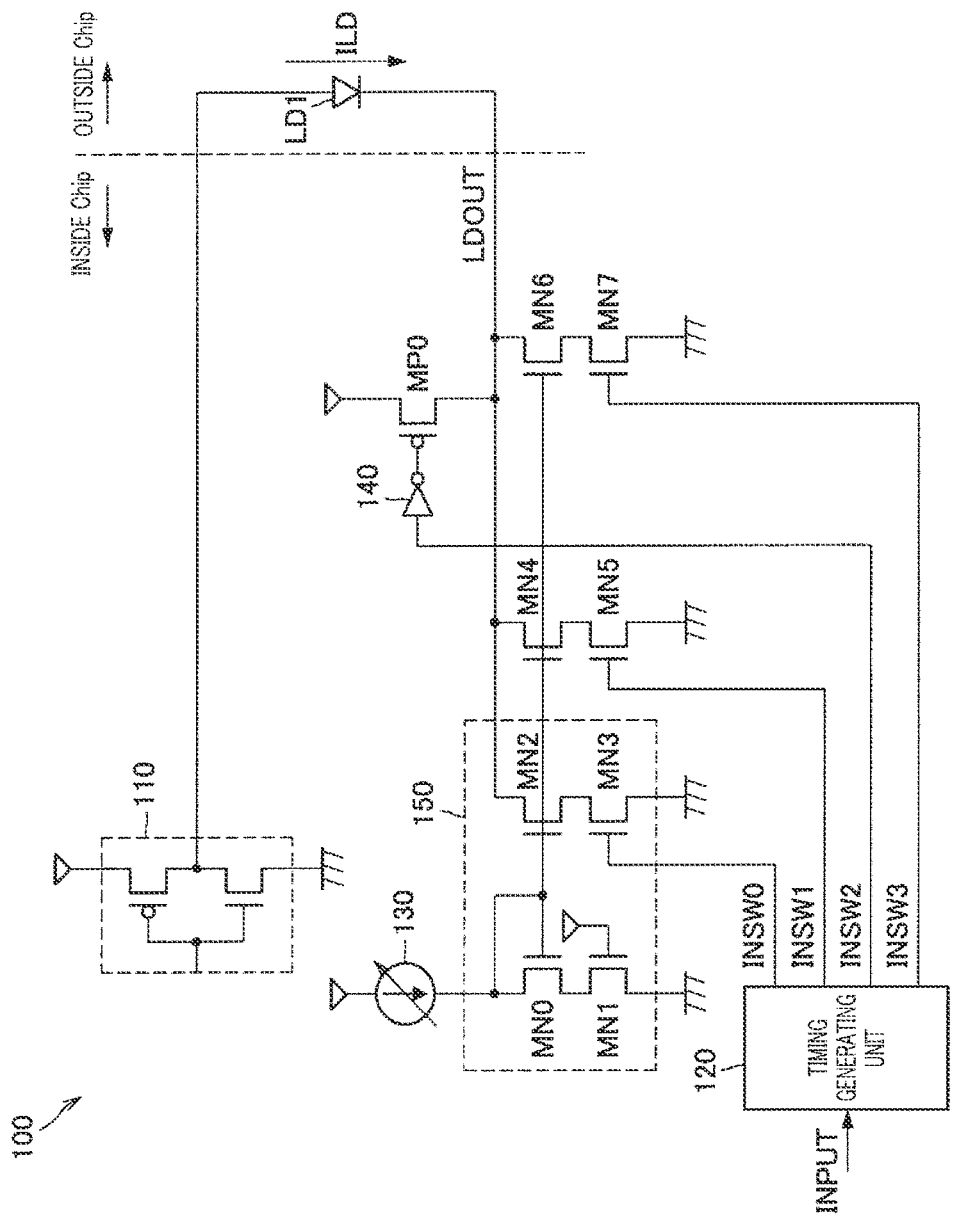
FIG. 1 is an explanatory diagram showing a configuration example of a laser apparatus including a laser drive circuit according to a first embodiment of the present disclosure.

Descriptions will be given in the following order.
1. First embodiment
1.1. Configuration example
1.2. Modifications
2. Second embodiment
2.1. Configuration example
2.2. Modifications
3. Third embodiment
4. Summary 1. First Embodiment 1.1. Configuration Example First, a laser drive circuit and a laser apparatus including the laser drive circuit according to a first embodiment of the present disclosure will be described. FIG. 1 is an explanatory diagram showing a configuration example of the laser apparatus including the laser drive circuit according to the first embodiment of the present disclosure. Hereinafter, a configuration example of the laser apparatus including the laser drive circuit according to the first embodiment of the present disclosure will be described with reference to FIG. 1.

As shown in FIG. 1, a laser apparatus 100 according to the first embodiment of the present disclosure is configured to include a light-emitting diode LD1 and a laser drive circuit for driving light emission of the light-emitting diode LD1. The laser drive circuit is configured to include a switch unit 110, a timing generating unit 120, a current source 130, an inversion element 140, and a driver circuit 150 constituted by a current mirror made up of N-type transistors MN0 to MN3 and a switch. The laser drive circuit is configured to further include a P-type transistor MP0 and N-type transistors MN4 to MN7.

The laser apparatus 100 according to the first embodiment of the present disclosure can be used as, for example, a distance-measuring sensor adopting a ToF (Time of Flight) system. A distance-measuring sensor of the ToF system is a sensor that measures a distance to an object using a time of flight of laser light. Distance-measuring sensors of the ToF system include those using a Direct ToF (D-ToF) system that measures a distance to an object by directly measuring a time of flight and those using an InDirect ToF (I-ToF) system that measures a distance to an object by replacing a time of flight with an exposure amount to indirectly measure the time of flight.

The switch unit 110 has a configuration in which an N-type transistor and a P-type transistor are connected in parallel. Each transistor is switched on and off when a predetermined signal is applied to a gate of each transistor. By switching each transistor of the switch unit 110 on and off, supply of a current to the light-emitting diode LD1 is controlled.

The timing generating unit 120 is a block that generates signals for controlling on/off switching with respect to the N-type transistors MN3, MN5, and MN7 and the P-type transistor MP0. Each signal is generated from a signal INPUT that is supplied to the timing generating unit 120. In the example shown in FIG. 1, a gate of the N-type transistor MN3 is supplied with a signal INSW0, a gate of the N-type transistor MN5 is supplied with a signal INSW1, a gate of the P-type transistor MP0 is supplied with a signal INSW2, and a gate of the N-type transistor MN7 is supplied with a signal INSW3. While an interior of the timing generating unit 120 can be constituted by, for example, a delay element and various logic circuits, the interior of the timing generating unit 120 is not limited to a specific configuration as long as a signal of which a state transitions at timings to be described later can be generated.

The current source 130 is a current source with respect to gates of the N-type transistors MN0, MN2, MN4, and MN6, and a current from the current source 130 changes the N-type transistors MN0, MN2, MN4, and MN6 to an on-state. The inversion element 140 is an element which inverts the signal INSW2 from the timing generating unit 120 and supplies the inverted signal to the gate of the P-type transistor MP0. It should be noted that the N-type transistors MN4 and MN6 need not be current mirror-connected and a constant voltage may be applied to the gates of the N-type transistors MN4 and MN6.

The driver circuit 150 is a circuit for driving light emission by the light-emitting diode LD1. Light emission by the light-emitting diode LD1 is controlled by switching on and off the N-type transistor MN3 among the transistors shown in the driver circuit 150. As described above, on/off switching of the N-type transistor MN3 is controlled by the signal INSW0 from the timing generating unit 120.

The P-type transistor MP0 is provided in order to short-circuit a cathode-side output LDOUT of the light-emitting diode LD1 to a predetermined potential. Specifically, the P-type transistor MP0 is switched on and off when the signal INSW2 from the timing generating unit 120 is applied to the gate of the P-type transistor MP0 via the inversion element 140. When the P-type transistor MP0 is switched on, the cathode-side output LDOUT of the light-emitting diode LD1 is short-circuited to the predetermined potential. In addition, when the P-type transistor MP0 is switched off, the cathode-side output LDOUT of the light-emitting diode LD1 is separated from the predetermined potential.

The N-type transistors MN4 and MN5 being connected in series are transistors provided in order to reduce a rise time of an emission waveform of the light-emitting diode LD1. By switching on the N-type transistor MN5 with the signal INSW1, a current can be drawn from the light-emitting diode LD1 not only by the driver circuit 150 but also by the N-type transistors MN4 and MN5. Drawing a current from the light-emitting diode LD1 not only by the driver circuit 150 but also by the N-type transistors MN4 and MN5 enables the rise time of the emission waveform of the light-emitting diode LD1 to be reduced.

On the other hand, the N-type transistors MN6 and MN7 being connected in series are transistors provided in order to reduce a fall time of the emission waveform of the light-emitting diode LD1. In the present embodiment, when extinguishing the light-emitting diode LD1, a current that flows through the light-emitting diode LD1 is temporarily increased by the N-type transistors MN6 and MN7. In other words, by switching on the N-type transistor MN7 with the signal INSW3, a current can be drawn from the light-emitting diode LD1 not only by the driver circuit 150 but also by the N-type transistors MN6 and MN7. Accordingly, the current that flows through the light-emitting diode LD1 temporarily increases. By temporarily increasing the current that flows through the light-emitting diode LD1 and subsequently switching on the P-type transistor MP0 when extinguishing the light-emitting diode LD1, due to the cathode-side output LDOUT of the light-emitting diode LD1 being short-circuited to the predetermined potential, the fall time of the emission waveform of the light-emitting diode LD1 can be reduced.

Definitions of a rise time and a fall time according to the present embodiment will now be described. In the present embodiment, a Low Level is assumed to be 0 A and a High Level is assumed to be 1 A, and a time between 10% to 90% at the levels are considered. A current threshold exists when a laser emits light and when the laser is extinguished. In particular, when a laser apparatus is used as a distance-measuring sensor, passing through the current threshold at high speed leads to ranging accuracy. Therefore, it is important to minimize the rise time and the fall time.

The laser apparatus 100 shown in FIG. 1 is configured such that the light-emitting diode LD1 is provided outside a chip and other circuits are provided inside the chip.

This concludes the description of the configuration example of the laser apparatus 100 according to the first embodiment of the present disclosure with reference to FIG. 1. Next, an operation of the laser apparatus 100 according to the first embodiment of the present disclosure will be described.

Figure 2:
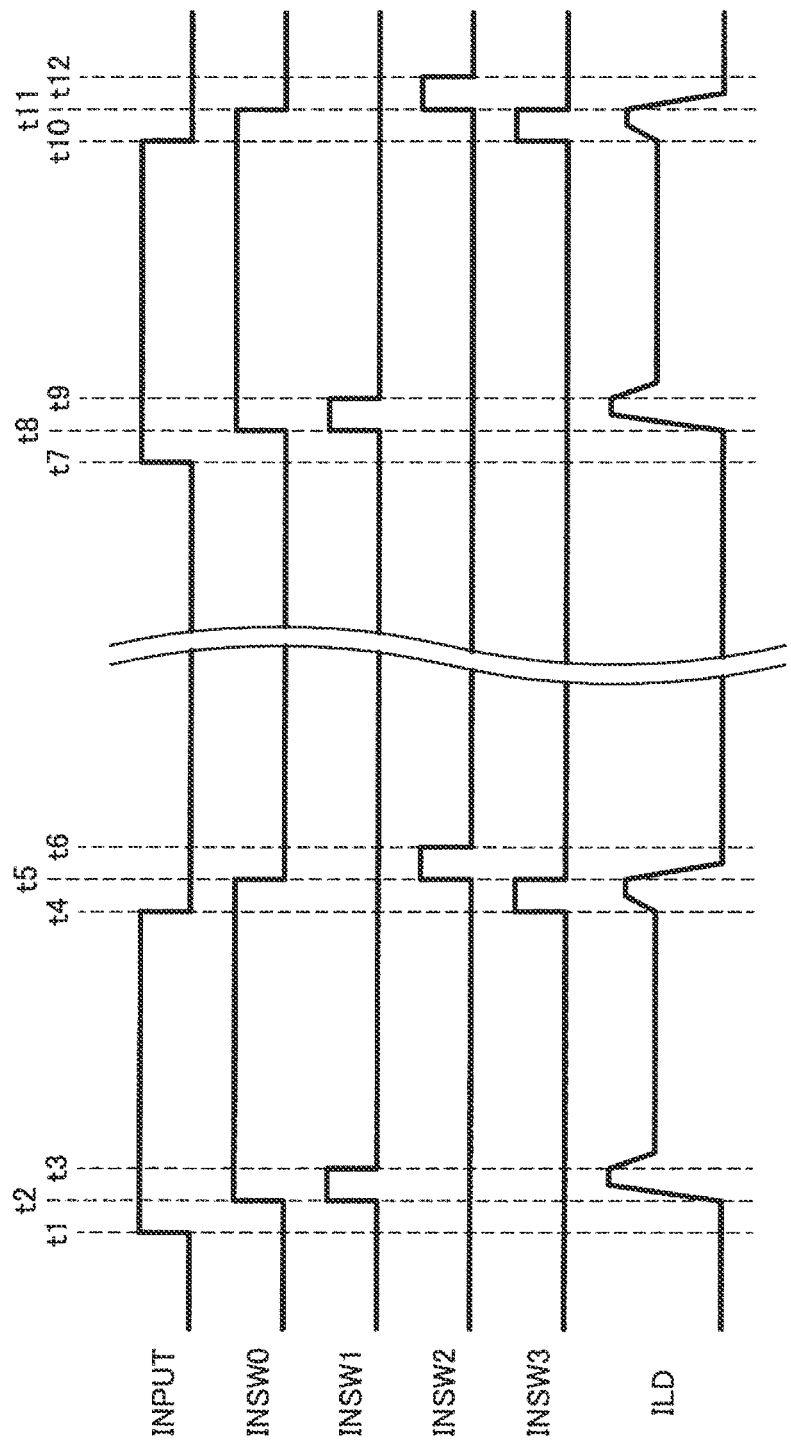
FIG. 2 is an explanatory diagram showing an operation of the laser apparatus according to the embodiment.

FIG. 2 is an explanatory diagram showing an operation of the laser apparatus 100 according to the first embodiment of the present disclosure. FIG. 2 shows a timing chart of a signal INPUT that is input to the timing generating unit 120 and signals INSW0 to ISNW3 that are generated by the timing generating unit 120 based on the signal INPUT, and an approximate current waveform of a current ILD that flows through the light-emitting diode LD1.

First, at a time t1, the signal INPUT changes from low to high. As a result, at a subsequent time point of a time t2, the signals INSW0 and INSW1 that are generated by the timing generating unit 120 change from low to high. Due to the signals INSW0 and INSW1 changing from low to high, the N-type transistors MN3 and MN5 are switched from off to on. Due to the N-type transistors MN3 and MN5 being switched from off to on, a current flows through the light-emitting diode LD1. At this point, by simultaneously switching on the N-type transistor MN5 in addition to the N-type transistor MN3, the laser apparatus 100 can accelerate a rise of the current ILD that flows through the light-emitting diode LD1.

At a subsequent time point of a time t3, the signal INSW1 that is generated by the timing generating unit 120 changes from high to low. Due to the signal INSW1 changing from high to low, the N-type transistor MN5 is switched from on to off. Due to the N-type transistor MN5 being switched from on to off, an amount of the current ILD flowing through the light-emitting diode LD1 slightly decreases.

At a subsequent time point of a time t4, the signal INPUT changes from high to low. As a result, the signal INSW3 that is generated by the timing generating unit 120 changes from low to high. Due to the signal INSW3 changing from low to high, the N-type transistor MN7 is switched from off to on. Due to the N-type transistor MN7 being switched from off to on, an amount of the current ILD flowing through the light-emitting diode LD1 increases.

At a subsequent time point of a time t5, the signals INSW0 and INSW3 that are generated by the timing generating unit 120 change from high to low. In addition, at the time point of the time t5, the signal INSW2 that is generated by the timing generating unit 120 changes from low to high. Due to the signals INSW0 and INSW3 changing from high to low, the N-type transistors MN3 and MN7 are switched from on to off. The N-type transistors MN3 and MN7 are switched from on to off. At a same timing of the switching of the N-type transistors MN3 and MN7 from on to off, the signal INSW2 is switched from low to high. Due to these two operations, an amount of the current ILD that flows through the light-emitting diode LD1 suddenly drops to 0. In other words, due to the N-type transistor MN7 being switched from off to on and the amount of the current ILD flowing through the light-emitting diode LD1 increasing at a timing immediately before the light-emitting diode LD1 is extinguished (at the time point of the time t4 described above), the laser apparatus 100 can accelerate a fall of the current ILD that flows through the light-emitting diode LD1.

In addition, due to the signal INSW2 being switched from low to high, the P-type transistor MP0 is switched on and the cathode-side output LDOUT of the light-emitting diode LD1 is short-circuited to the predetermined potential.

At a subsequent time point of a time t6 where the current ILD becomes 0, the signal INSW2 that is generated by the timing generating unit 120 changes from high to low. Due to the signal INSW2 changing from high to low, the P-type transistor MP0 is switched off.

Subsequently, a similar operation is repeated at times t7 to t12.

By executing the operation described above, the laser apparatus 100 according to the first embodiment of the present disclosure is capable of accelerating the rise time and the fall time during a light emission operation of the light-emitting diode LD1. It should be noted that timings and pulse widths of state transitions of the respective signals shown in FIG. 2 are merely examples and the timings and the pulse widths are not limited to those shown in FIG. 2.

Figure 3:
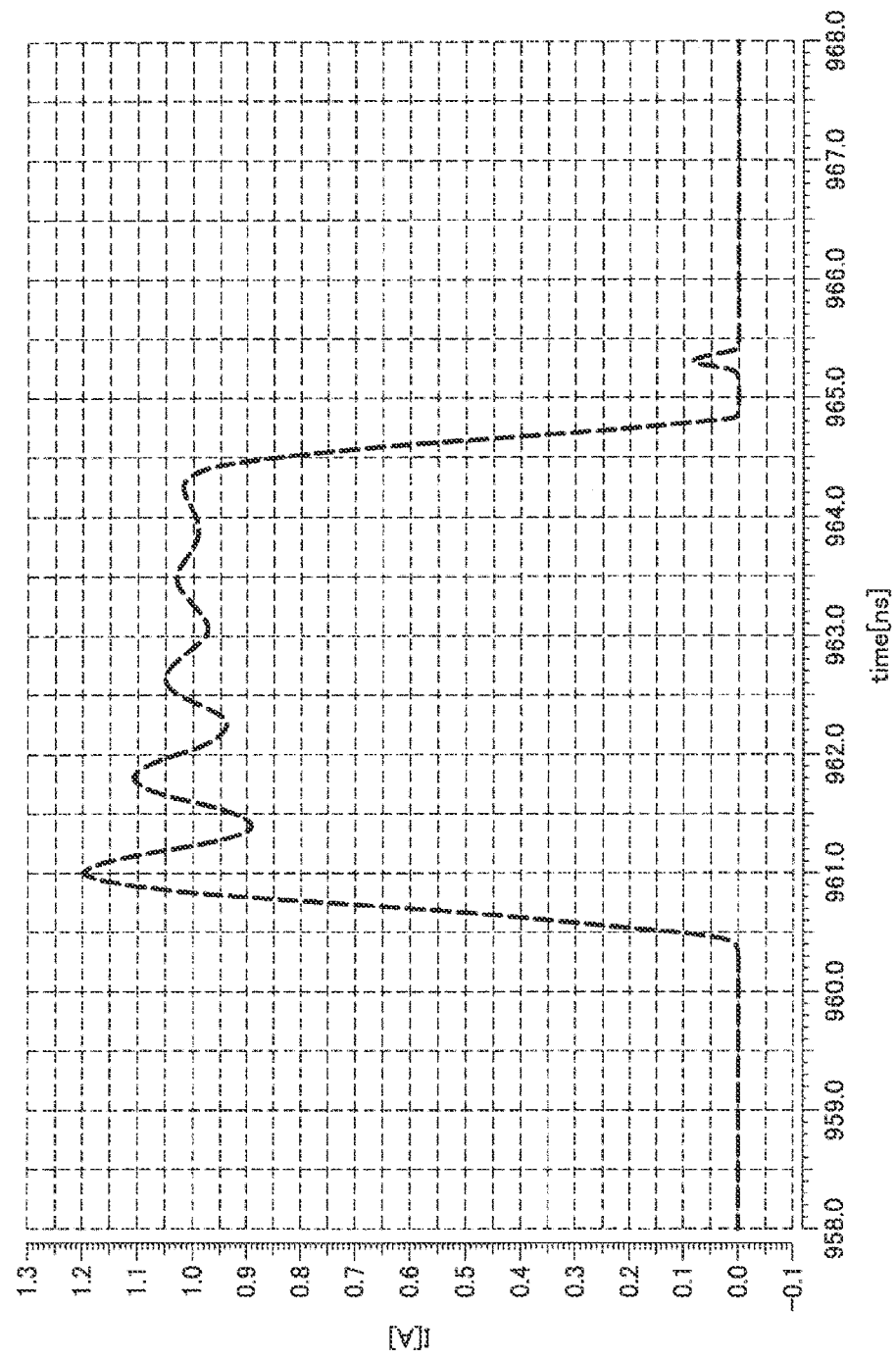
FIG. 3 is an explanatory diagram showing an example of a current waveform of a light-emitting diode using a graph.

An advantageous effect of the laser apparatus 100 according to the first embodiment of the present disclosure will now be described. FIG. 3 is an explanatory diagram showing an example of a current waveform of the light-emitting diode LD1 using a graph when a current is drawn from the light-emitting diode LD1 solely by the driver circuit 150. In addition, FIG. 4 is an explanatory diagram showing an example of a current waveform of the light-emitting diode LD1 using a graph when a current is drawn from the light-emitting diode LD1 not only by the driver circuit 150 but also by the N-type transistors MN4 and MN5.

Figure 4:
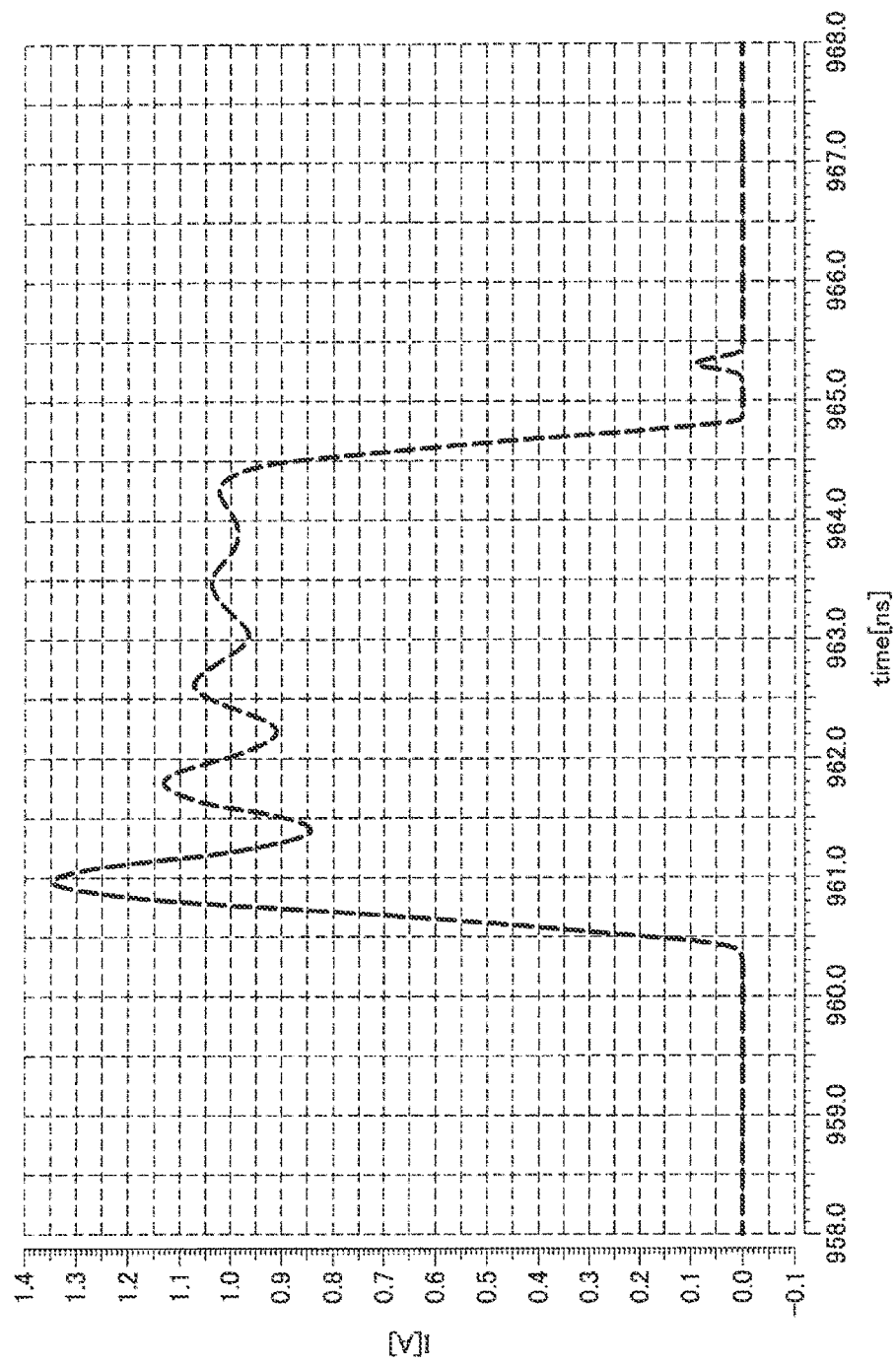
FIG. 4 is an explanatory diagram showing an example of a current waveform of a light-emitting diode using a graph.

A comparison between FIGS. 3 and 4 reveals that a rise time of the current waveform of the current ILD of the light-emitting diode LD1 is faster in FIG. 4. Therefore, it is shown that, drawing a current from the light-emitting diode LD1 not only by the driver circuit 150 but also by the N-type transistors MN4 and MN5 expedites the rise time of the emission waveform of the current ILD of the light-emitting diode LD1.

Figure 5:
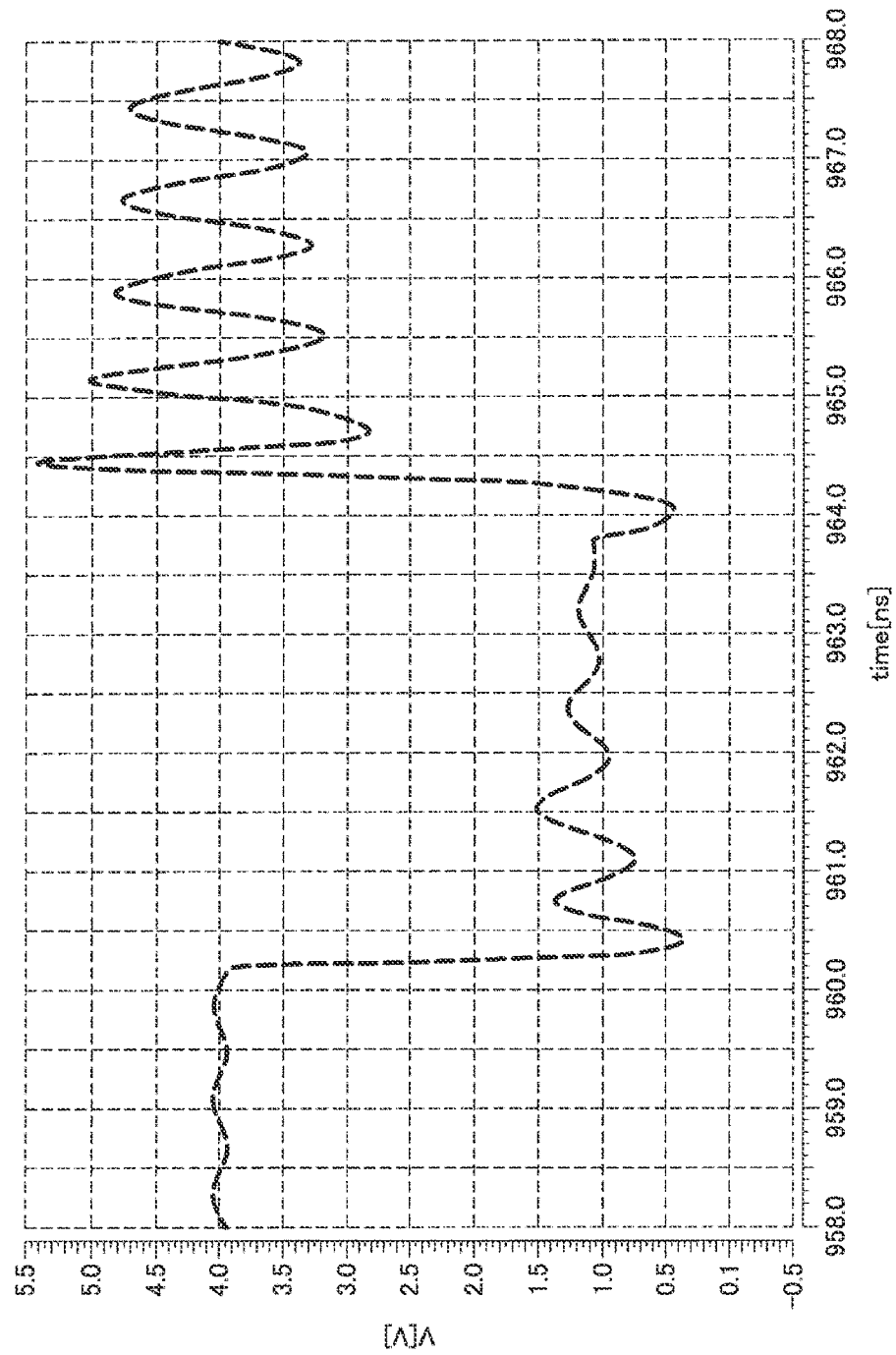
FIG. 5 is an explanatory diagram showing an example of a change in potential of a cathode-side output of a light-emitting diode.

FIG. 5 is an explanatory diagram showing an example of a change in potential of the cathode-side output LDOUT of the light-emitting diode LD1. FIG. 5 shows an example of a change in potential of the output LDOUT when the N-type transistors MN6 and MN7 and the P-type transistor MP0 are provided. Specifically, a current is drawn from the light-emitting diode LD1 by the N-type transistors MN6 and MN7 at a timing immediately before extinguishing the light-emitting diode LD1, and by switching on the P-type transistor MP0 at approximately a same timing as extinguishing the light-emitting diode LD1, a cathode potential of the light-emitting diode LD1 is short-circuited to a power supply, and the P-type transistor MP0 is subsequently switched off. In this manner, by drawing a current from the light-emitting diode LD1 by the N-type transistors MN6 and MN7 at a timing immediately before extinguishing the light-emitting diode LD1 and then switching on the P-type transistor MP0, the potential of the output LDOUT temporarily drops and subsequently rises as shown in FIG. 5.

Figure 6:
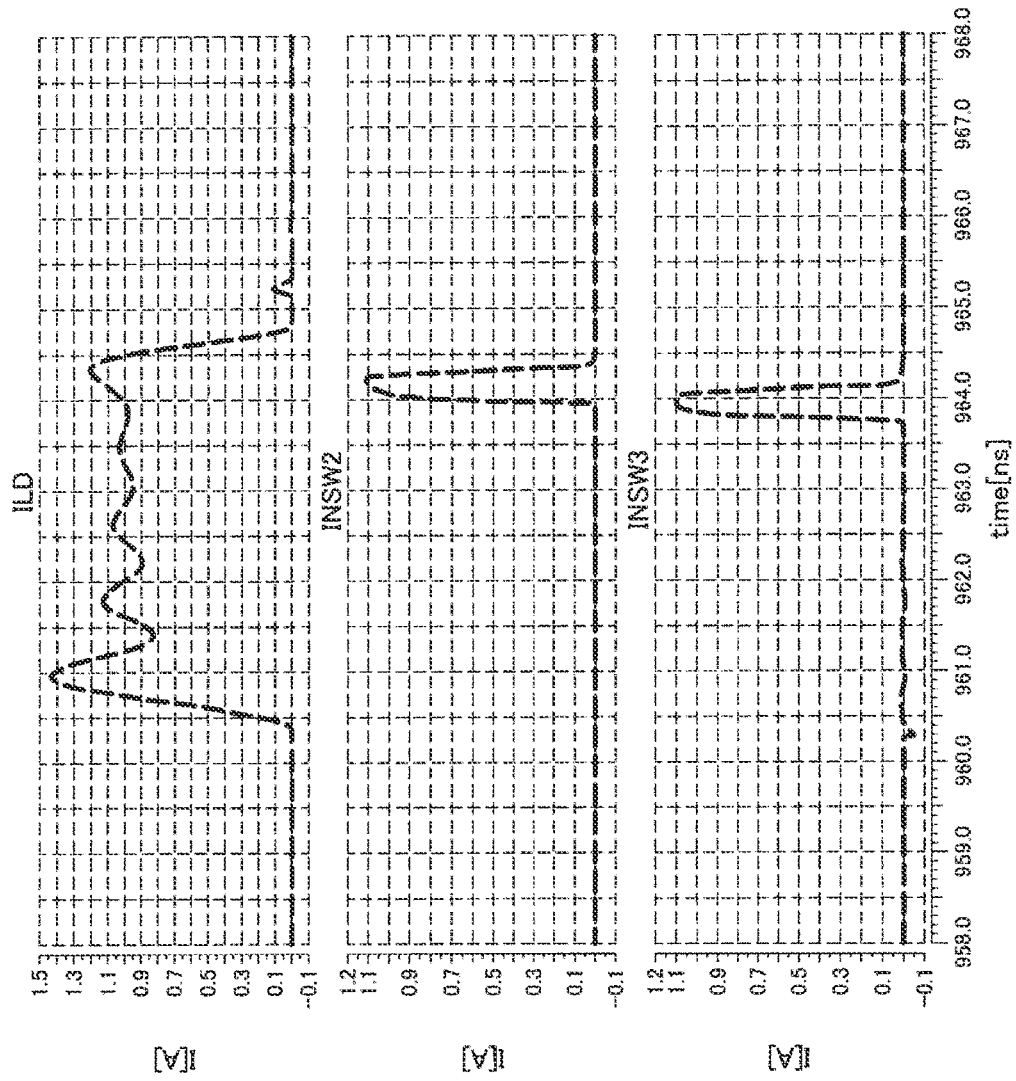
FIG. 6 is an explanatory diagram showing an example of a current waveform of a current of a light-emitting diode and a waveform of a signal generated by a timing generating unit.

FIG. 6 is an explanatory diagram showing an example of a current waveform of the current ILD of the light-emitting diode LD1 and waveforms of the signals INSW2 and INSW3. As shown in FIG. 6, by outputting the signal INSW3 to the gate of the N-type transistor MN7, the current waveform of the current ILD of the light-emitting diode LD1 temporarily rises. Subsequently, by switching on the P-type transistor MP0 with the signal INSW2 and short-circuiting the cathode potential of the light-emitting diode LD1 to power supply voltage, the current ILD abruptly drops to 0 amperes.

The laser apparatus 100 may adjust the rise time and the fall time of the current waveform of the current ILD of the light-emitting diode LD1 by adjusting rising pulses of the signals INSW1, INSW2, and INSW3.

For comparison, an example of a change in potential of the output LDOUT and an example of the current waveform of the current ILD of the light-emitting diode LD1 when the N-type transistors MN6 and MN7 are not provided will be described.

Figure 7:
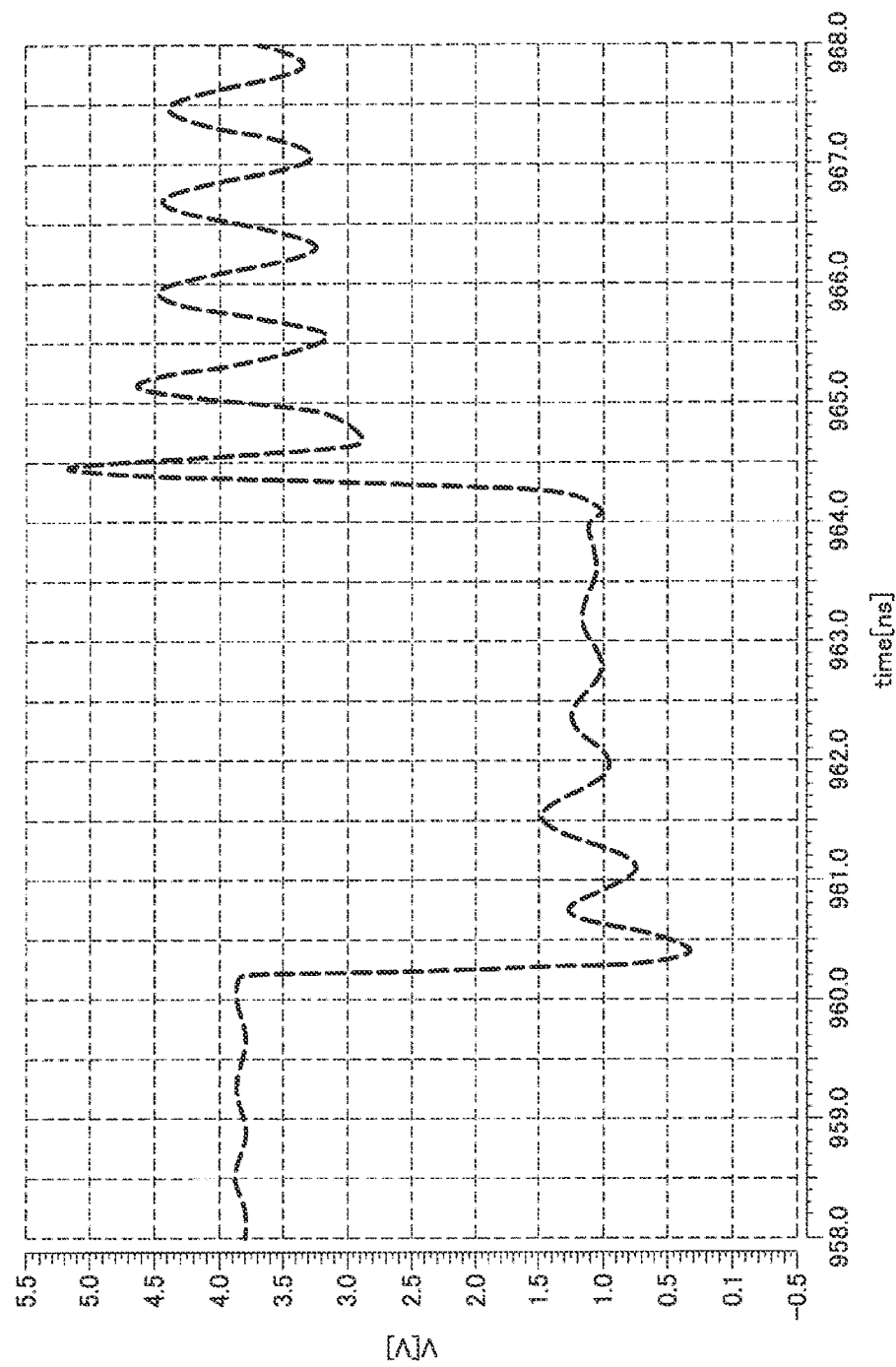
FIG. 7 is an explanatory diagram showing an example of a change in potential of a cathode-side output of a light-emitting diode.

FIG. 7 is an explanatory diagram showing an example of a change in potential of the cathode-side output LDOUT of the light-emitting diode LD1. FIG. 7 shows an example of a change in potential of the output LDOUT when the N-type transistors MN6 and MN7 are not provided. As shown, when the N-type transistors MN6 and MN7 are not provided, the potential of the output LDOUT rises to a predetermined potential without dropping at a timing where the light-emitting diode LD1 is extinguished.

Figure 8:
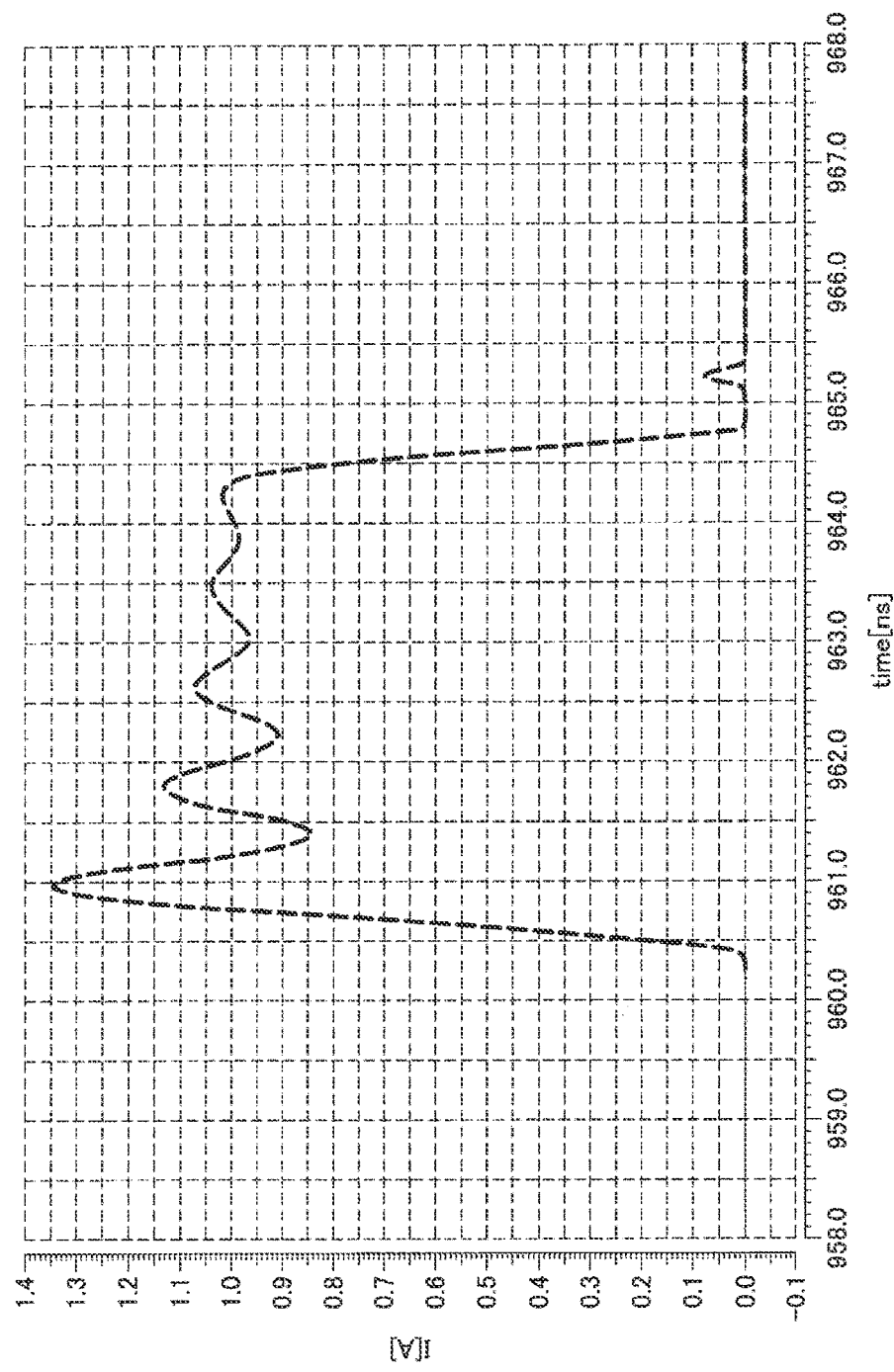
FIG. 8 is an explanatory diagram showing an example of a current waveform of a current of a light-emitting diode.

FIG. 8 is an explanatory diagram showing an example of a current waveform of the current ILD of the light-emitting diode LD1. FIG. 8 shows an example of the current waveform of the current ILD of the light-emitting diode LD1 when the N-type transistors MN6 and MN7 are not provided. As shown, when the N-type transistors MN6 and MN7 are not provided, the current ILD drops to 0 amperes without the current waveform temporarily rising at a timing where the light-emitting diode LD1 is extinguished.

A comparison between the waveforms shown in FIG. 6 and the waveform shown in FIG. 8 reveals that the fall time is shorter when the N-type transistors MN6 and MN7 are provided and a current amount is temporarily increased at a timing where the light-emitting diode LD1 is extinguished as shown in FIG. 6. Therefore, it is shown that, drawing a current from the light-emitting diode LD1 not only by the driver circuit 150 but also by the N-type transistors MN6 and MN7 expedites the fall time of the emission waveform of the current ILD of the light-emitting diode LD1.

As described above, the laser apparatus 100 according to the first embodiment of the present disclosure is capable of accelerating the rise time and the fall time of the current waveform of the current ILD of the light-emitting diode LD1.

1.2. Modifications

While the laser apparatus 100 shown in FIG. 1 is provided with the P-type transistor MP0 and short-circuits the cathode-side output LDOUT of the light-emitting diode LD1 to a predetermined potential at a timing where the light-emitting diode LD1 is extinguished, the present disclosure is not limited to this example.

Figure 9:
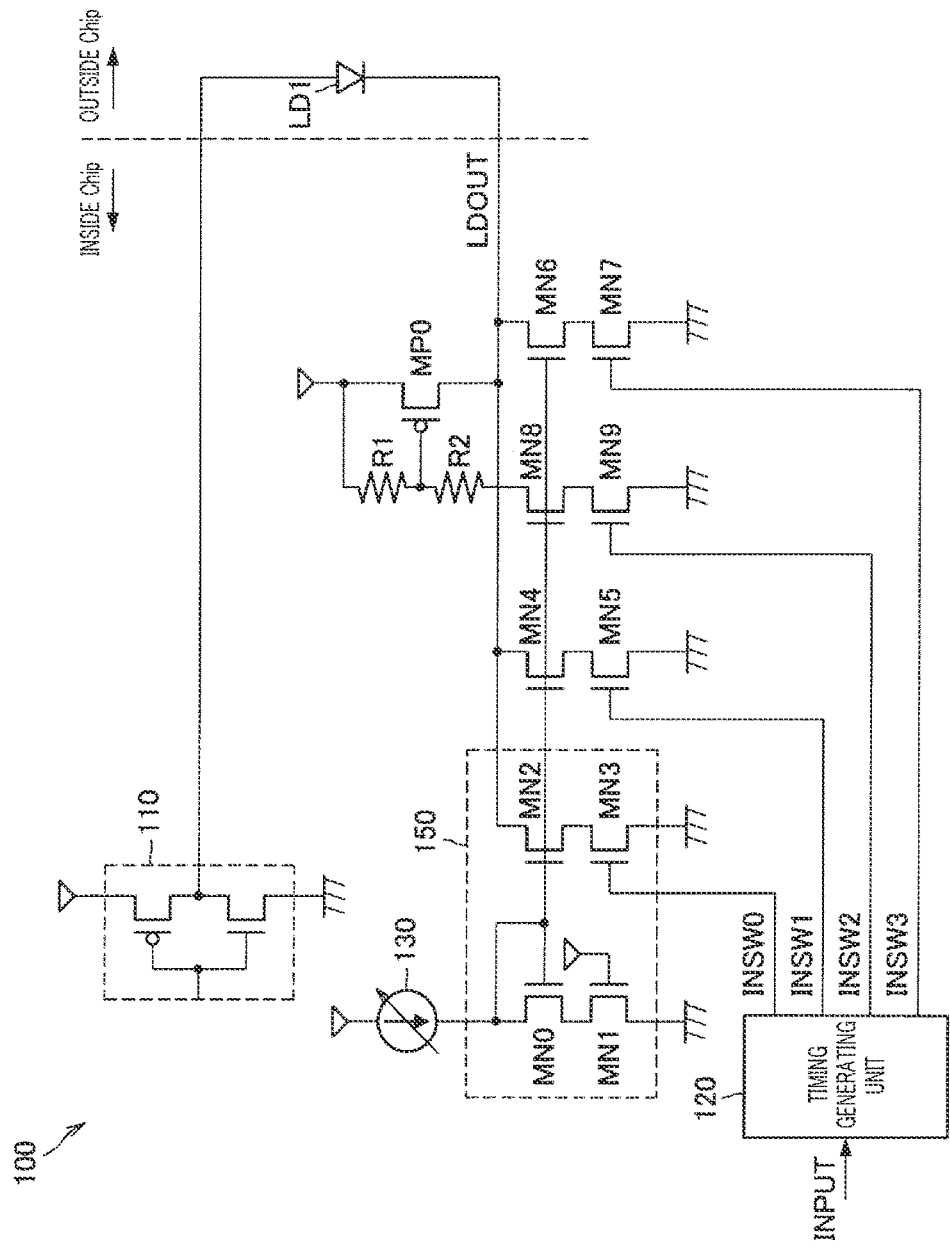
FIG. 9 is an explanatory diagram showing a modification of the laser apparatus according to the embodiment.

FIG. 9 is an explanatory diagram showing a modification of the laser apparatus 100 according to the first embodiment of the present disclosure. When a withstand voltage of the gate terminal of the P-type transistor MP0 prevents the signal INSW2 from being received, for example, a configuration may be adopted in which a level shifting circuit made up of resistors R1 and R2, and N-type transistors MN8 and MN9, are provided to divide to voltage in order to lower the voltage to be applied to the gate terminal of the P-type transistor MP0.

Figure 10:
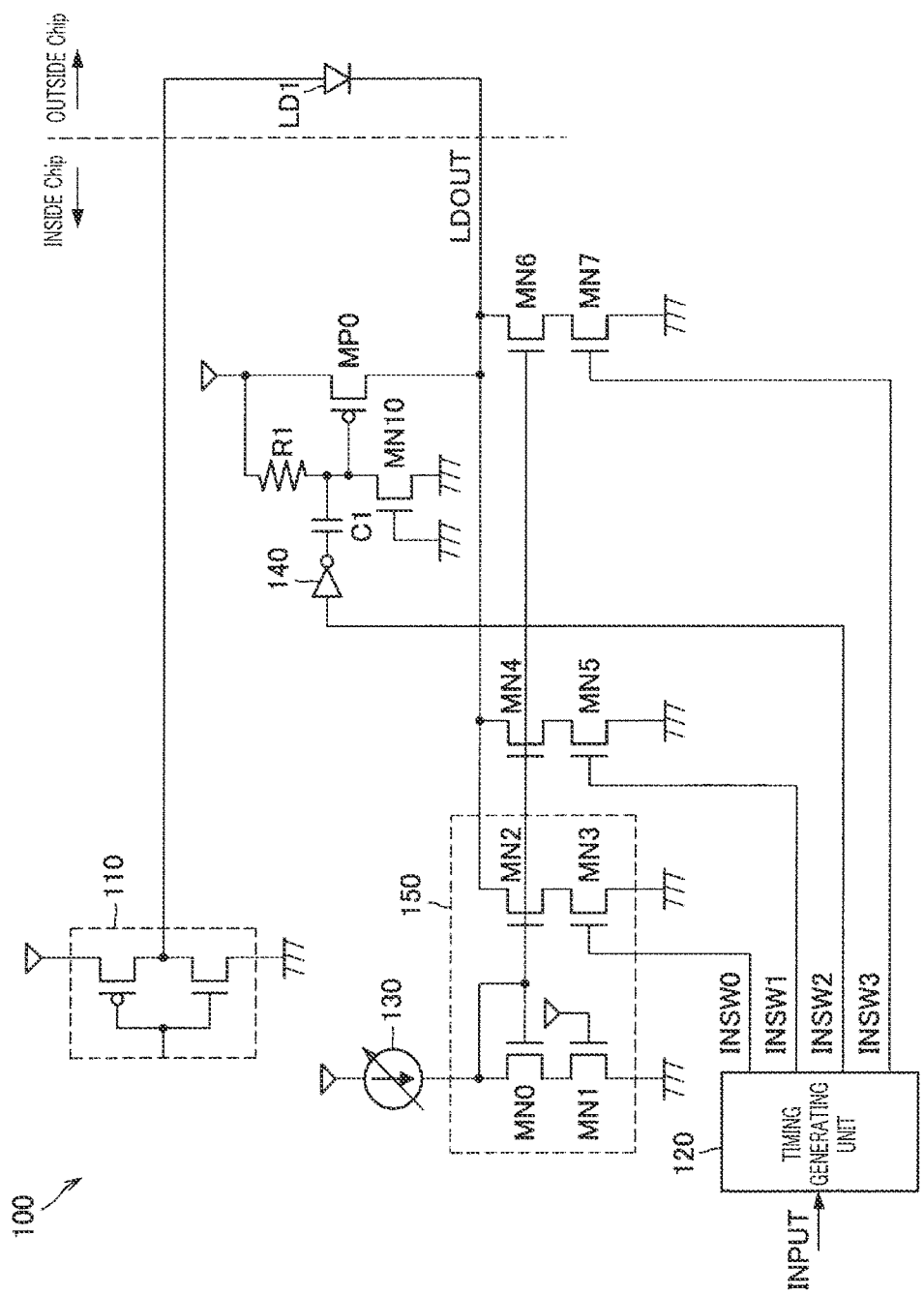
FIG. 10 is an explanatory diagram showing a modification of the laser apparatus according to the embodiment.

FIG. 10 is an explanatory diagram showing a modification of the laser apparatus 100 according to the first embodiment of the present disclosure. FIG. 10 shows a configuration in which the gate of the P-type transistor MP0 of the laser apparatus 100 shown in FIG. 1 is further provided with a capacitive element C1, a resistor R1, and an N-type transistor MN10. When a withstand voltage of the gate terminal of the P-type transistor MP0 prevents the signal INSW2 from being received, even a configuration in which the gate of the P-type transistor MP0 is further provided with the capacitive element C1, the resistor R1, and the N-type transistor MN10 enables the fall time of the current waveform of the current ILD to be accelerated.

Figure 11:
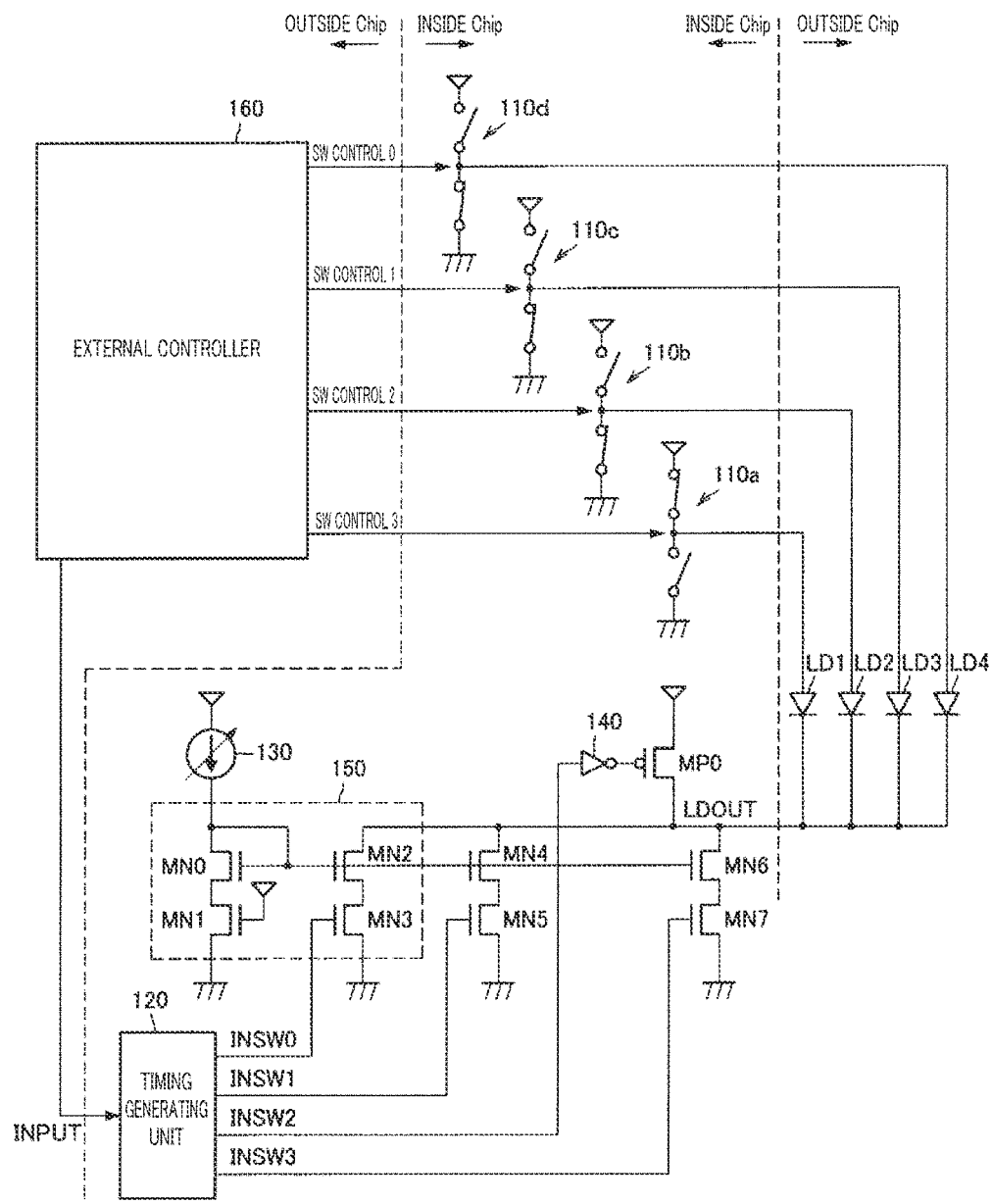
FIG. 11 is an explanatory diagram showing an overall configuration example of the laser apparatus according to the embodiment.

FIG. 11 is an explanatory diagram showing an overall configuration example of the laser apparatus 100 according to the first embodiment of the present disclosure. FIG. 11 shows a configuration in which an external controller 160 is added to the laser apparatus 100 shown in FIG. 1. Furthermore, FIG. 11 shows the laser apparatus 100 in which four light-emitting diodes LD1, LD2, LD3, and LD4 are provided in parallel. Emission of light of the four light-emitting diodes LD1, LD2, LD3, and LD4 is respectively controlled by switch units 110a, 110b, 110c, and 110d. The switch units 110a, 110b, 110c, and 110d are switched on and off based on a control signal INPUT from the external controller 160. In addition, the external controller 160 supplies the timing generating unit 120 with a control signal. The timing generating unit 120 generates the signals INSW0 to INSW3 using the control signal INPUT from the external controller 160 and outputs the generated signals.

By having the configuration shown in FIG. 11, the laser apparatus 100 according to the first embodiment of the present disclosure can control light emission operations and extinguishing operations by a plurality of light-emitting diodes at high speed.

As described above, the first embodiment of the present disclosure provides the laser apparatus 100 that is capable of reducing the rise time and the fall time of light emission of a light-emitting diode. Since the laser apparatus 100 according to the first embodiment of the present disclosure is capable of reducing the rise time and the fall time of light emission of a light-emitting diode, a ranging institution can be improved particularly when the laser apparatus 100 is used in a distance-measuring sensor.

In the example described above, a reduction in the fall time of light emission is achieved by temporarily lowering and then raising a potential of the cathode-side output LDOUT when extinguishing the light-emitting diode LD1. The laser apparatus 100 according to the first embodiment of the present disclosure may have a configuration which achieves a further reduction in the fall time of light emission by temporarily raising and then lowering the potential of the cathode-side output LDOUT when the light-emitting diode LD1 emits light.

While the example described above adopts a configuration in which a current is drawn from the cathode side of the light-emitting diode LD1, the present disclosure is not limited to this example. Even when a configuration in which a current is input to an anode side of the light-emitting diode LD1 is adopted, a configuration that further reduces the rise time and the fall time of light emission of the light-emitting diode can be similarly adopted.

2. Second Embodiment

2.1. Configuration Example

Figure 12:
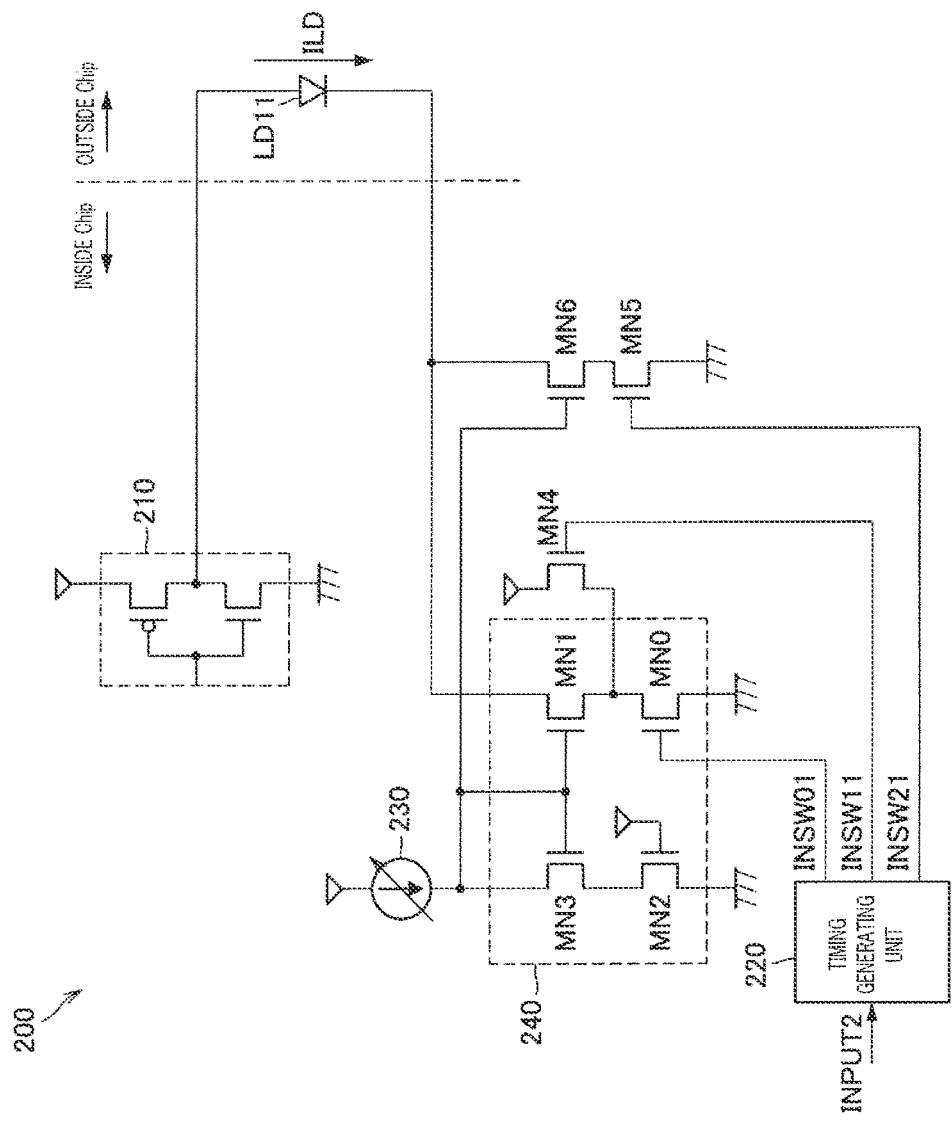
FIG. 12 is an explanatory diagram showing a configuration example of a laser apparatus including a laser drive circuit according to a second embodiment of the present disclosure.

Next, a laser drive circuit and a laser apparatus including the laser drive circuit according to a second embodiment of the present disclosure will be described. FIG. 12 is an explanatory diagram showing a configuration example of the laser apparatus including the laser drive circuit according to the second embodiment of the present disclosure. Hereinafter, a configuration example of the laser apparatus including the laser drive circuit according to the second embodiment of the present disclosure will be described with reference to FIG. 12.

As shown in FIG. 12, a laser apparatus 200 according to the second embodiment of the present disclosure is configured to include a light-emitting diode LD11 and a laser drive circuit for driving light emission of the light-emitting diode LD11. The laser drive circuit is configured to include a switch unit 210, a timing generating unit 220, a current source 230, and a driver circuit 240 constituted by a current mirror made up of N-type transistors MN0 to MN3 and a switch. The laser drive circuit is configured to further include N-type transistors MN4 to MN6.

The laser apparatus 200 according to the second embodiment of the present disclosure is used as, for example, a distance-measuring sensor adopting a ToF system. A distance-measuring sensor of the ToF system is a sensor that measures a distance to an object using a time of flight of laser light.

The switch unit 210 has a configuration in which an N-type transistor and a P-type transistor are connected in parallel. Each transistor is switched on and off when a predetermined signal is applied to a gate of each transistor. By switching each transistor of the switch unit 210 on and off, supply of a current to the light-emitting diode LD11 is controlled.

The timing generating unit 220 is a block that generates signals for controlling on/off switching with respect to the N-type transistors MN0, MN4, and MN5. Each signal is generated from a signal INPUT2 that is supplied to the timing generating unit 220. In the example shown in FIG. 12, a gate of the N-type transistor MN0 is supplied with a signal INSW01, a gate of the N-type transistor MN4 is supplied with a signal INSW11, and a gate of the N-type transistor MN5 is supplied with a signal INSW2. While an interior of the timing generating unit 220 can be constituted by, for example, a delay element and various logic circuits, the interior of the timing generating unit 220 is not limited to a specific configuration.

The current source 230 is a current source with respect to gates of the N-type transistors MN1 and MN3, and a current from the current source 230 changes the N-type transistors MN1 and MN3 to an on-state.

The driver circuit 240 is a circuit for driving light emission by the light-emitting diode LD11. Light emission by the light-emitting diode LD11 is controlled by switching on and off the N-type transistor MN0 among the transistors shown in the driver circuit 240. As described above, on/off switching of the N-type transistor MN0 is controlled by the signal INSW01 from the timing generating unit 220.

Reducing the fall time of the current ILD of the light-emitting diode LD11 requires that the current ILD be quickly stopped. In addition, since the current ILD increases for the purpose of light emission by the light-emitting diode LD11, a size of the N-type transistor MN0 increases. However, increasing the size of the N-type transistor MN0 also ends up increasing parasitic capacitance and affects the rise time and the fall time of the current ILD.

In consideration thereof, the laser apparatus 200 according to the second embodiment of the present disclosure has a configuration in which the N-type transistor MN4 is provided in parallel to the N-type transistor MN1. The N-type transistor MN4 is provided in order to make the parasitic capacitance of the N-type transistor MN0 inconspicuous. Although details will be provided later, a signal that switches on the N-type transistor MN4 is output from the timing generating unit 220 at a timing where the N-type transistor MN0 is switched off. Accordingly, the laser apparatus 200 can reduce the fall time of the current ILD of the light-emitting diode LD11 by making the parasitic capacitance of the N-type transistor MN0 inconspicuous.

In other words, the driver circuit 240 has a configuration that operates so as to cause a gate-source voltage of the N-type transistor MN1 to drop to 0 when extinguishing the light-emitting diode LD11. In other words, the driver circuit 240 operates so as to switch on the N-type transistor MN4, raise a source potential of the N-type transistor MN1, and cause the gate-source voltage of the N-type transistor MN1 to drop to 0 when extinguishing the light-emitting diode LD11. Therefore, the N-type transistor MN4 functions as an example of the voltage drop unit according to the present disclosure.

Definitions of a rise time and a fall time according to the present embodiment will now be described. In the present embodiment, a Low Level is assumed to be 0 A and a High Level is assumed to be 1 A, and a time between 10% to 90% at the levels are considered. A current threshold exists when a laser emits light and when the laser is extinguished. Passing through the current threshold at high speed leads to ranging accuracy particularly when a laser apparatus is used as a distance-measuring sensor. Therefore, it is important to expedite the rise time and the fall time.

The laser apparatus 200 shown in FIG. 12 is configured such that the light-emitting diode LD11 is provided outside a chip and other circuits are provided inside the chip.

This concludes the description of the configuration example of the laser apparatus 200 according to the second embodiment of the present disclosure with reference to FIG.

12. Next, an operation of the laser apparatus 200 according to the second embodiment of the present disclosure will be described.

Figure 13:
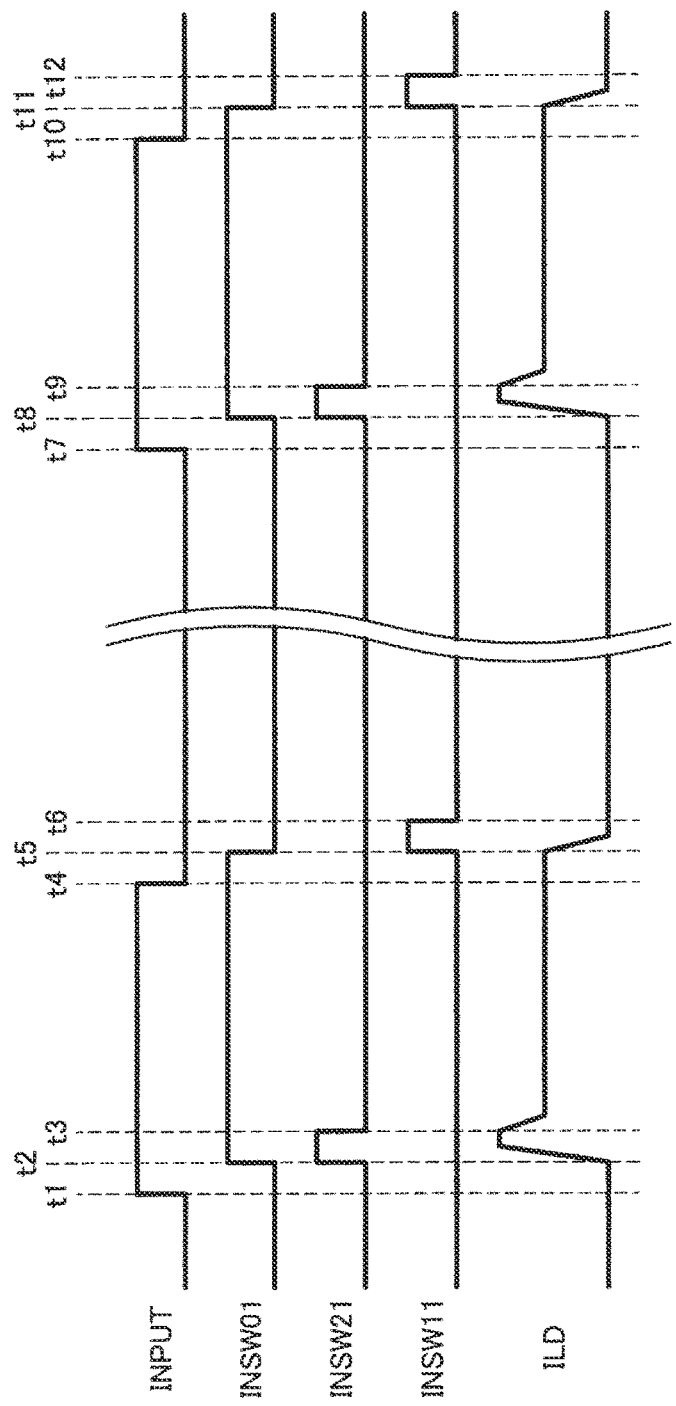
FIG. 13 is an explanatory diagram showing an operation of the laser apparatus according to the embodiment.

FIG. 13 is an explanatory diagram showing an operation of the laser apparatus 200 according to the second embodiment of the present disclosure. FIG. 13 shows a timing chart of a signal INPUT that is input to the timing generating unit 220 and signals INSW01 to ISNW21 that are generated by the timing generating unit 220 based on the signal INPUT, and an approximate current waveform of the current ILD that flows through the light-emitting diode LD1.

First, at a time t1, the signal INPUT changes from low to high. As a result, at a subsequent time point of a time t2, the signals INSW01 and INSW21 that are generated by the timing generating unit 220 change from low to high. Due to the signals INSW01 and INSW21 changing from low to high, the N-type transistors MN0 and MN5 are switched from off to on. Due to the N-type transistors MN0 and MN5 being switched from off to on, a current flows through the light-emitting diode LD11. At this point, by simultaneously switching on the N-type transistor MN5 in addition to the N-type transistor MN0, the laser apparatus 200 can accelerate a rise of the current ILD that flows through the light-emitting diode LD11.

At a subsequent time point of a time t3, the signal INSW21 that is generated by the timing generating unit 220 changes from high to low. Due to the signal INSW21 changing from high to low, the N-type transistor MN5 is switched from on to off. Due to the N-type transistor MN5 being switched from on to off, an amount of the current ILD flowing through the light-emitting diode LD11 slightly decreases.

At a subsequent time point of a time t4, the signal INPUT changes from high to low. As a result, at a subsequent time point of a time t5, the signal INSW01 that is generated by the timing generating unit 220 changes from high to low. Due to the signal INSW01 changing from high to low, the N-type transistor MN0 is switched from on to off. Due to the N-type transistor MN0 being switched from on to off, an amount of the current ILD flowing through the light-emitting diode LD11 suddenly drops to 0.

In addition, at the time point of the time t5, the signal INSW11 that is generated by the timing generating unit 220 changes from low to high. Due to the signal INSW11 changing from low to high, the N-type transistor MN4 is switched from off to on. By switching on the N-type transistor MN4, the laser apparatus 200 can reduce the fall time of the current ILD of the light-emitting diode LD11 by making the parasitic capacitance of the N-type transistor MN0 inconspicuous.

At a subsequent time point of a time t6, the signal INSW11 that is generated by the timing generating unit 220 changes from high to low. Due to the signal INSW11 changing from high to low, the N-type transistor MN4 is switched from on to off.

Subsequently, a similar operation is repeated at times t7 to t12.

By executing the operation described above, the laser apparatus 200 according to the second embodiment of the present disclosure is capable of accelerating the rise time and the fall time during a light emission operation of the light-emitting diode LD11. It should be noted that timings and pulse widths of state transitions of the respective signals shown in FIG. 13 are merely examples and the timings and the pulse widths are not limited to those shown in FIG. 13.

Figure 14:
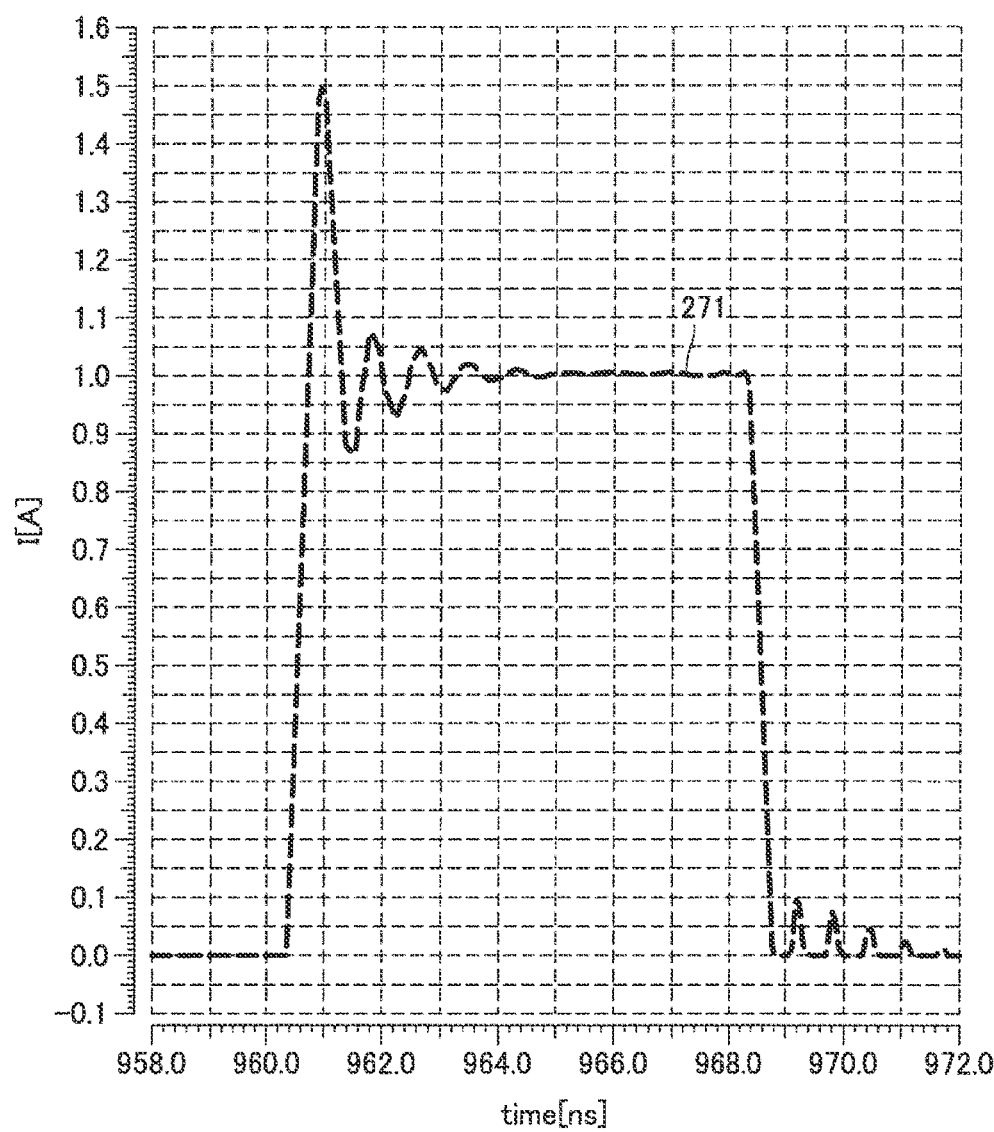
FIG. 14 is an explanatory diagram showing an example of a current waveform of a light-emitting diode according to the embodiment using a graph.
Figure 15:
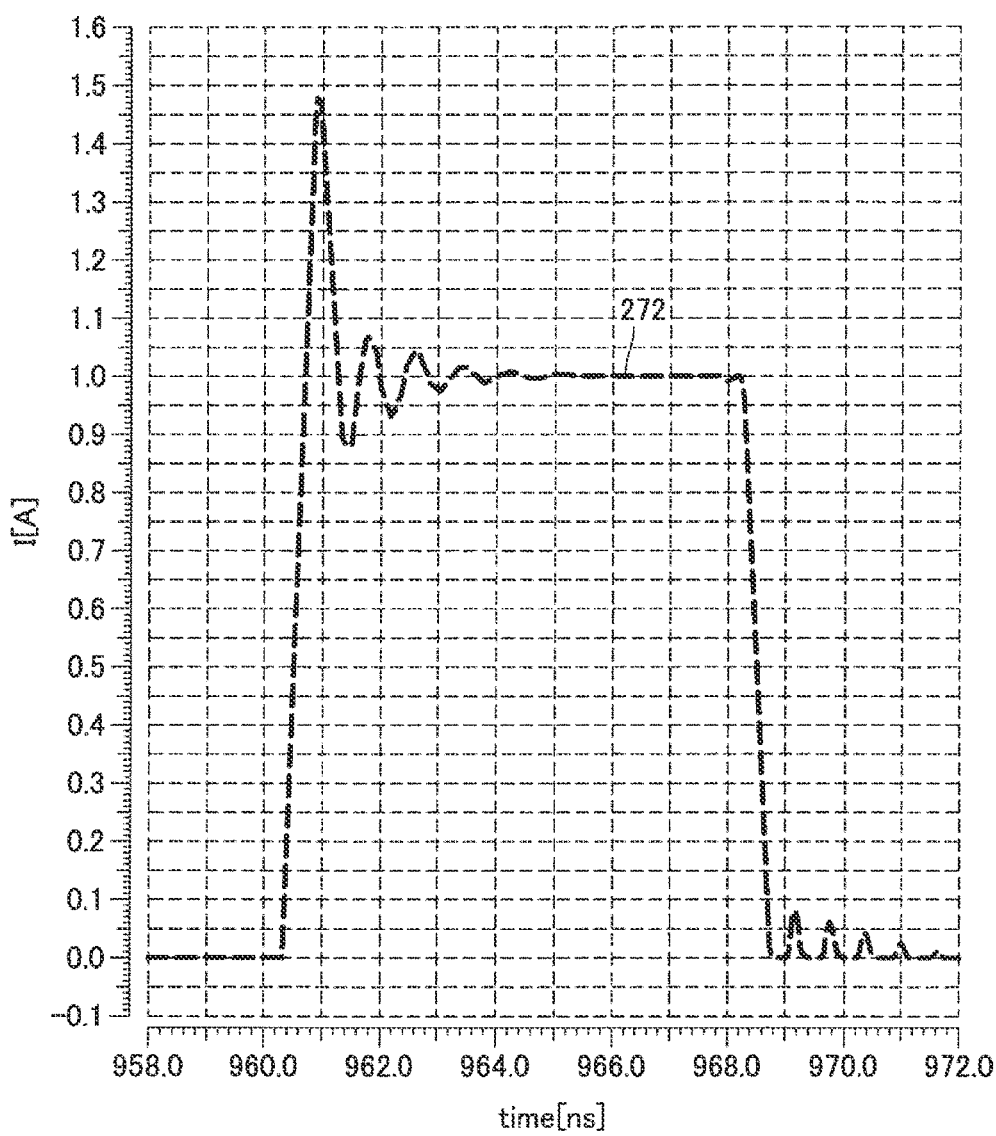
FIG. 15 is an explanatory diagram showing an example of a current waveform of a light-emitting diode using a graph.

An advantageous effect of the laser apparatus 200 according to the second embodiment of the present disclosure will now be described. FIG. 14 is an explanatory diagram showing an example of a current waveform 271 of the light-emitting diode LD1 using a graph when the N-type transistor MN4 is provided to interrupt a current from the light-emitting diode LD1. In addition, FIG. 15 is an explanatory diagram showing an example of a current waveform 272 of the light-emitting diode LD1 using a graph when a current from the light-emitting diode LD1 is interrupted without providing the N-type transistor MN4. Furthermore, FIG. 16 is an explanatory diagram showing a graph created by superimposing fall portions of the current waveform 271 shown in FIG. 14 and the current waveform 272 shown in FIG. 15 with each other and enlarging an abscissa.

Figure 16:
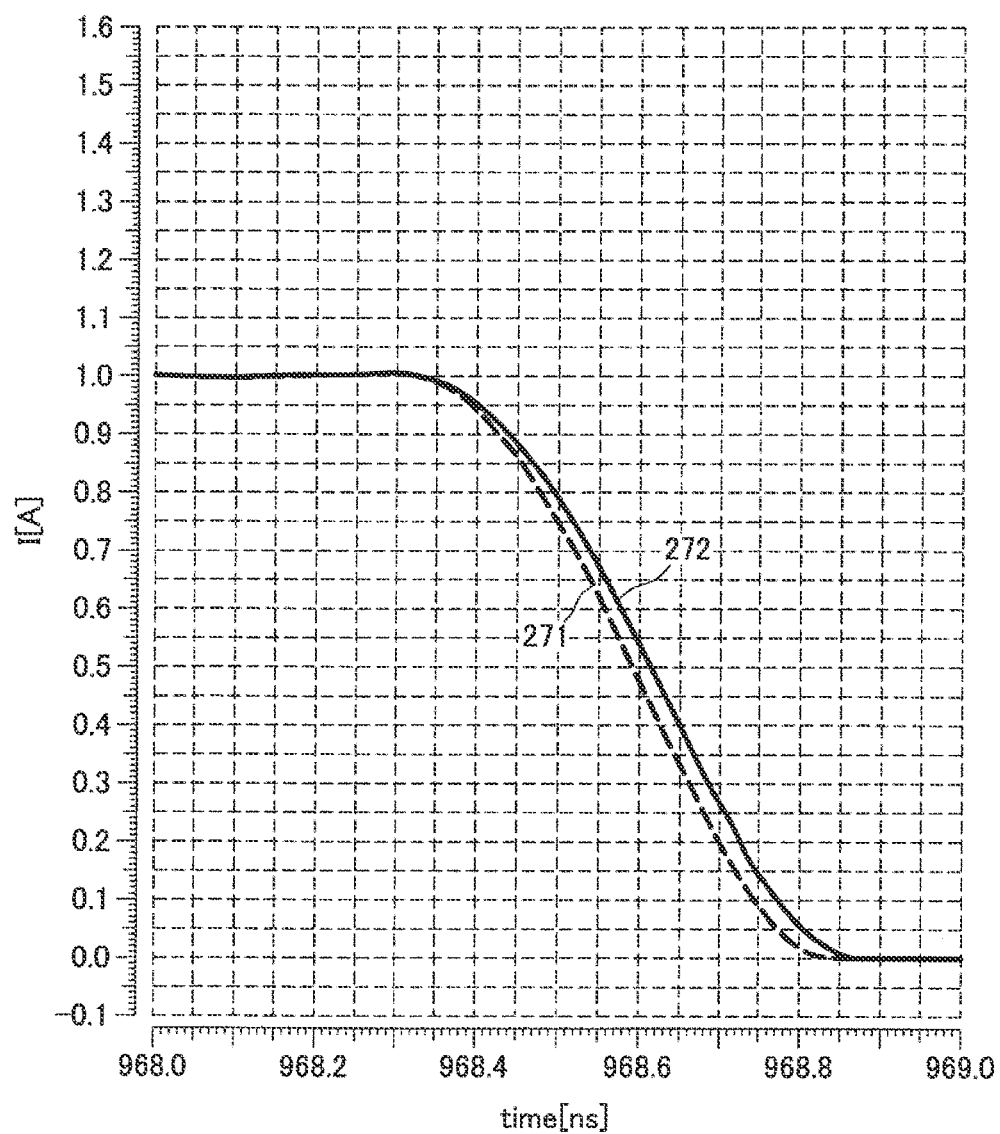
FIG. 16 is an explanatory diagram showing an example of a current waveform of a light-emitting diode using a graph.

As shown in FIG. 16, it is revealed that the fall of the current waveform 271 that represents interrupting the current from the light-emitting diode LD1 by providing the N-type transistor MN4 has been expedited from that of the current waveform 272. Therefore, the laser apparatus 200 according to the second embodiment of the present disclosure is capable of accelerating not only the rise time but also the fall time during a light emission operation of the light-emitting diode LD11.

2.2. Modifications

While the laser apparatus 200 according to the second embodiment of the present disclosure reduces the fall time of the current ILD of the light-emitting diode LD11 by providing the N-type transistor MN4 to make the parasitic capacitance of the N-type transistor MN0 inconspicuous, the present disclosure is not limited to this example.

Figure 17:
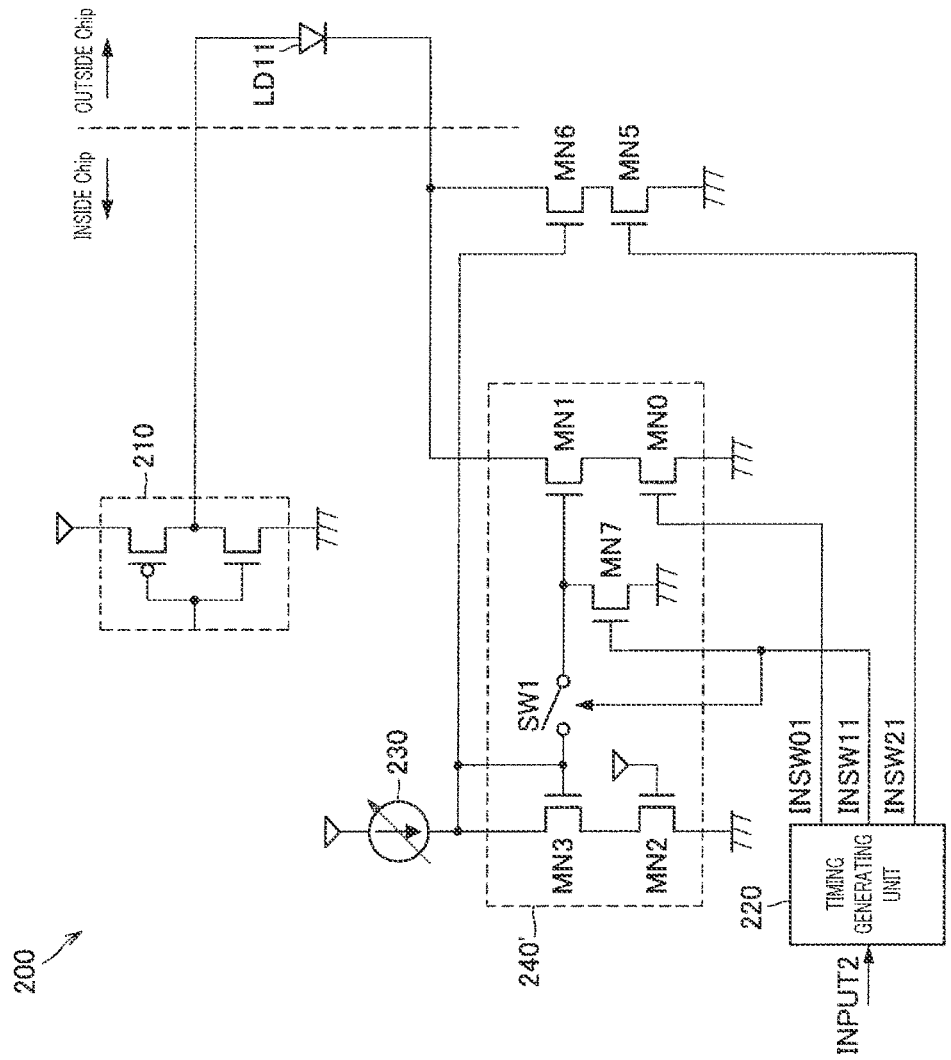
FIG. 17 is an explanatory diagram showing a modification of the laser apparatus according to the embodiment.

FIG. 17 is an explanatory diagram showing a modification of the laser apparatus 200 according to the second embodiment of the present disclosure. FIG. 17 shows a configuration that includes, as a driver circuit 240', N-type transistors MN0 to MN3 which constitute a current mirror, an N-type transistor MN7 that is connected to a gate of the N-type transistor MN1, and a switch SW1. A signal INSW11 generated by the timing generating unit 220 is sent to a gate of the N-type transistor MN7 and the switch SW1. High and low states of the signal INSW11 transition at same timings as those shown in FIG. 13.

When extinguishing the light-emitting diode LD11, due to the signal INSW11 changing from low to high at a timing where a potential of an anode-side output LDOUT of the light-emitting diode LD11 rises, the driver circuit 240' switches on the N-type transistor MN7 to open the switch SW1. In addition, by opening the switch SW1, the driver circuit 240' operates to interrupt a connection between the gate of the N-type transistor MN1 and the current source 230 and to switch off the N-type transistor MN1. In other words, the driver circuit 240' has a configuration that operates so as to cause a gate-source voltage of the N-type transistor MN1 to approach 0 when extinguishing the light-emitting diode LD11. Therefore, the N-type transistor MN7 and the switch SW1 function as an example of the voltage drop unit according to the present disclosure.

Specifically, in a similar manner to the timing chart shown in FIG. 13, the signal ISNW11 generated by the timing generating unit 220 is input to the N-type transistor MN7 and the switch SW1. By operating in this manner, the laser apparatus 200 shown in FIG. 17 can accelerate suspension of light emission by the light-emitting diode LD11.

Figure 18:
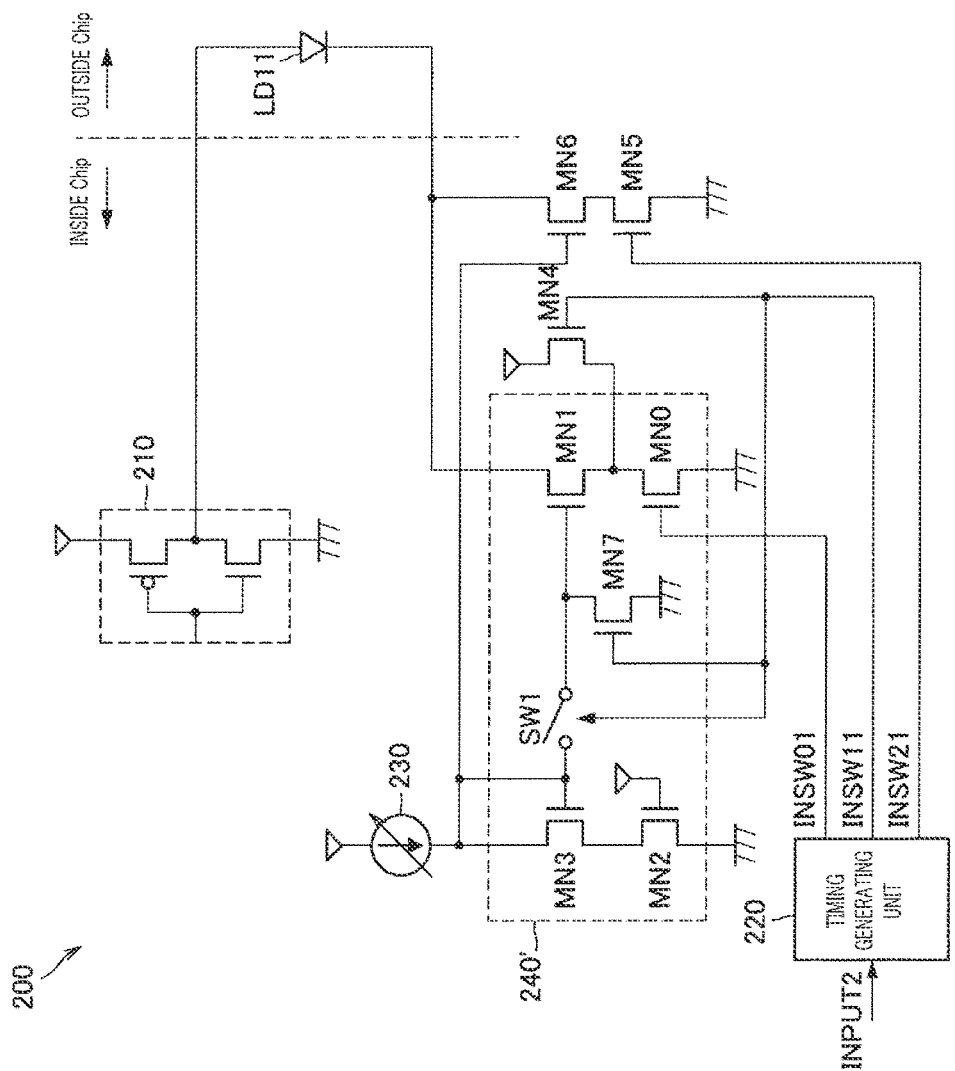
FIG. 18 is an explanatory diagram showing a modification of the laser apparatus according to the embodiment.

The laser apparatus 200 according to the second embodiment of the present disclosure may combine the circuit shown in FIG. 17 with the N-type transistor MN4 shown in FIG. 12. FIG. 18 is an explanatory diagram showing a modification of the laser apparatus 200 according to the second embodiment of the present disclosure. FIG. 18 shows a configuration example of the laser apparatus 200 that combines the circuit shown in FIG. 17 with the N-type transistor MN4 shown in FIG. 12.

In the laser apparatus 200 shown in FIG. 18, the signal ISNW11 generated by the timing generating unit 220 is input to the N-type transistors MN4 and MN7 and the switch SW1. In other words, the N-type transistors MN4 and M7 and the switch SW1 are switched on and off at a same timing. Specifically, in a similar manner to the timing chart shown in FIG. 13, the signal ISNW11 generated by the timing generating unit 220 is input to the N-type transistors MN4 and MN7 and the switch SW1. By operating in this manner, the laser apparatus 200 shown in FIG. 18 can accelerate suspension of light emission by the light-emitting diode LD11.

Figure 19:
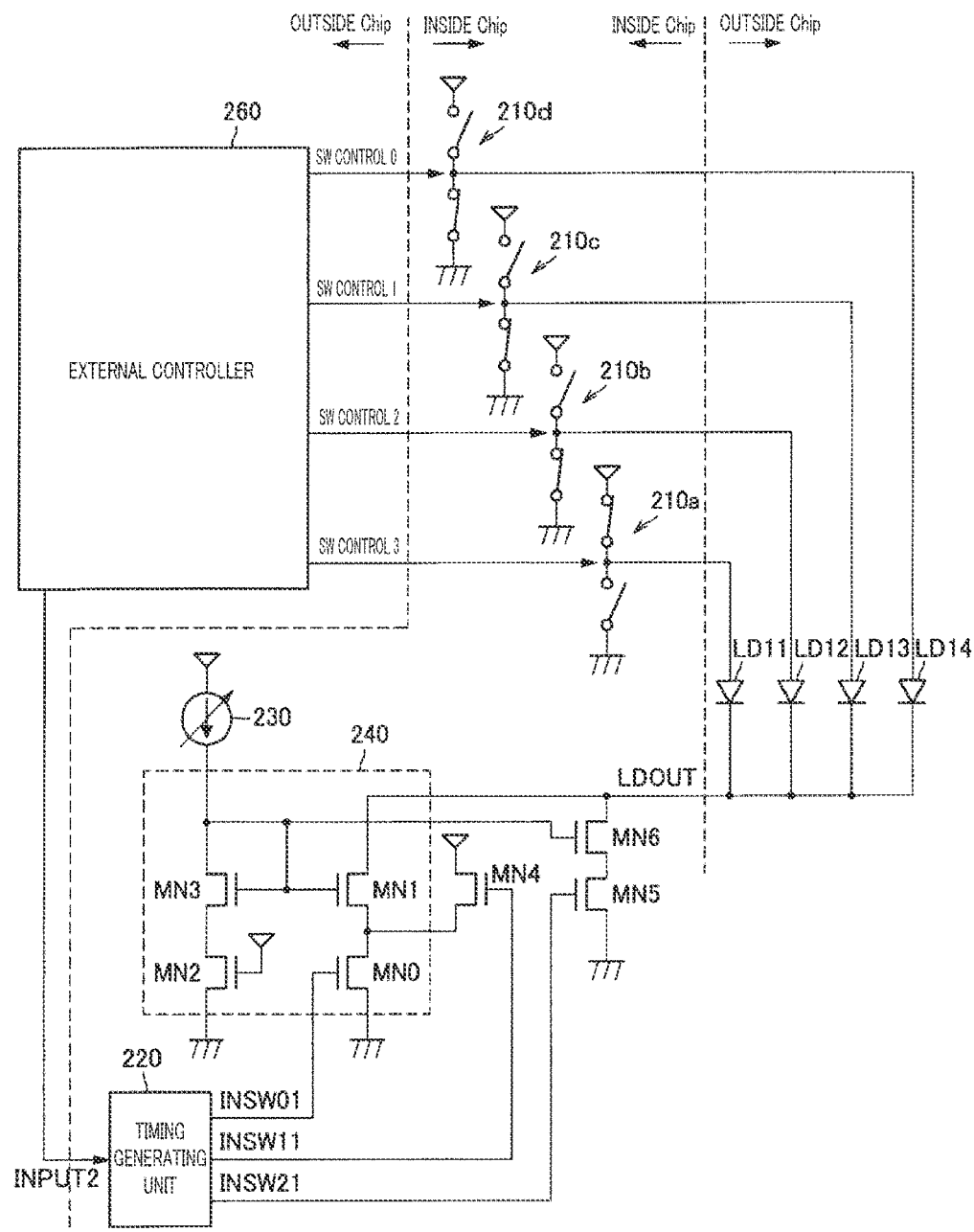
FIG. 19 is an explanatory diagram showing an overall configuration example of the laser apparatus according to the embodiment.

FIG. 19 is an explanatory diagram showing an overall configuration example of the laser apparatus 200 according to the second embodiment of the present disclosure. FIG. 19 shows a configuration in which an external controller 260 is added to the laser apparatus 200 shown in FIG. 12. Furthermore, FIG. 19 shows the laser apparatus 100 in which four light-emitting diodes LD11, LD12, LD13, and LD14 are provided in parallel. Emission of light of the four light-emitting diodes LD11, LD12, LD13, and LD14 is respectively controlled by switch units 210a, 210b, 210c, and 210d. The switch units 210a, 210b, 210c, and 210d are switched on and off based on a control signal INPUT2 from the external controller 260. In addition, the external controller 260 supplies the timing generating unit 220 with the control signal INPUT2. The timing generating unit 220 generates the signals INSW01 to INSW21 using the control signal from the external controller 260 and outputs the generated signals.

By having the configuration shown in FIG. 19, the laser apparatus 200 according to the second embodiment of the present disclosure can control light emission operations and extinguishing operations by a plurality of light-emitting diodes at high speed.

As described above, the second embodiment of the present disclosure provides the laser apparatus 200 that is capable of reducing the rise time and the fall time of light emission of a light-emitting diode. Since the laser apparatus 200 according to the second embodiment of the present disclosure is capable of reducing the rise time and the fall time of light emission of a light-emitting diode, a ranging institution can be improved particularly when the laser apparatus 200 is used in a distance-measuring sensor.

In the example described above, a reduction in the fall time of light emission is achieved by temporarily lowering and then raising a potential of the cathode-side output LDOUT when extinguishing the light-emitting diode LD11. The laser apparatus 200 according to the second embodiment of the present disclosure may have a configuration which achieves a further reduction in the fall time of light emission by temporarily raising and then lowering the potential of the cathode-side output LDOUT when the light-emitting diode LD11 emits light.

While the example described above adopts a configuration in which a current is drawn from the cathode side of the light-emitting diode LD11, the present disclosure is not limited to this example. Even when a configuration in which a current is input to an anode side of the light-emitting diode LD11 is adopted, a configuration that further reduces the rise time and the fall time of light emission of the light-emitting diode can be similarly adopted.

3. Third Embodiment

In the first embodiment of the present disclosure described above, a reduction in the fall time of a current waveform of a light-emitting diode is achieved by temporarily lowering and then raising a potential of a cathode-side output when extinguishing the light-emitting diode. In addition, in the second embodiment of the present disclosure, a reduction in the fall time of a current waveform of a light-emitting diode is achieved by performing an operation so as to cause a gate-source voltage of a transistor of a driver circuit to quickly approach 0 when extinguishing the light-emitting diode. Therefore, a laser apparatus having both the configuration of the first embodiment and the configuration of the second embodiment described above may be provided.

In other words, in the laser apparatus 200 shown in FIG. 12, the N-type transistors MN6 and MN7 and the P-type transistor MP0 shown in FIG. 1 may be provided on a cathode side of the light-emitting diode LD11. In addition, a configuration may be adopted which, in order to control on/off of the N-type transistor MN7 and the P-type transistor MP0, supplies a signal from the timing generating unit 220 to the gates of the respective transistors.

4. Summary

As described above, the first embodiment of the present disclosure provides the laser apparatus 100 capable of reducing a fall time of a current waveform of a light-emitting diode by temporarily lowering and then raising a potential of a cathode-side output when extinguishing the light-emitting diode. In addition, the second embodiment of the present disclosure provides the laser apparatus 200 capable of reducing a fall time of a current waveform of a light-emitting diode by performing an operation so as to cause a gate-source voltage of a transistor of a driver circuit to quickly drop to 0 when extinguishing the light-emitting diode.

The laser apparatuses according to the respective embodiments described above are capable of improving ranging accuracy particularly when the laser apparatuses are used as distance-measuring sensors by reducing a fall time of a current waveform of a light-emitting diode when extinguishing the light-emitting diode.

While preferred embodiments of the present disclosure have been described in detail with reference to the accompanying drawings, the technical scope of the present disclosure is not limited thereto. It will be obvious to a person with ordinary skill in the art to which the technical field of the present disclosure pertains that various modifications and changes can be arrived at without departing from the technical ideas as set forth in the appended claims and, as such, it is to be understood that such modifications and changes are to be naturally covered in the technical scope of the present disclosure.

In addition, the advantageous effects described in the present specification are merely descriptive or exemplary and not restrictive. In other words, the technique according to the present disclosure can produce, in addition to or in place of the advantageous effects described above, other advantageous effects that will obviously occur to those skilled in the art from the description of the present specification.

The following configurations are also covered in the technical scope of the present disclosure.

(1)

A laser drive circuit, including;

a first drive current unit configured to adjust, by a first MOSFET and a second MOSFET being connected in series, an inflow of a current to a light-emitting element that emits light in accordance with a current amount when the light-emitting element emits light and when the light-emitting element is extinguished;

a voltage drop unit configured to cause a gate-source voltage of the first MOSFET to drop when the light-emitting element is extinguished; and a timing generating unit configured to generate a signal for controlling driving of the first drive current unit and the voltage drop unit.

(2)

The laser drive circuit according to (1), wherein the voltage drop unit includes a third MOSFET that is provided between a source of the first MOSFET and a predetermined potential, and the timing generating unit is configured to output a signal for switching on the third MOSFET when extinguishing the light-emitting element.

(3)

The laser drive circuit according to (1) or (2), wherein the voltage drop unit includes a fourth MOSFET that is provided between a gate of the first MOSFET and a ground potential and a switch that is provided between the gate of the first MOSFET and a predetermined potential, and the timing generating unit is configured to output a signal for switching on the fourth MOSFET and switching off the switch when extinguishing the light-emitting element.

(4)

The laser drive circuit according to any one of (1) to (3), further including a second drive current unit which is provided in parallel to the first drive current unit and which is configured to control an inflow of a current to the light-emitting element when the light-emitting element emits light.

(5)

The laser drive circuit according to any one of (1) to (4), wherein the first drive current unit and the voltage drop unit are provided on a cathode side of the light-emitting element.

(6)

A sensor apparatus, including:

a light-emitting element configured to emit light in accordance with a current amount;

a first drive current unit configured to control, by a first MOSFET, an inflow of a current to the light-emitting element when the light-emitting element emits light and when the light-emitting element is extinguished;

a voltage drop unit configured to cause a gate-source voltage of the first MOSFET to drop when the light-emitting element is extinguished; and a timing generating unit configured to generate a signal for controlling driving of the first drive current unit and the voltage drop unit.

REFERENCE SIGNS LIST 100, 200 Laser apparatus
110, 210 Switch unit
130, 230 Current source
140 Inversion element
150, 240 Driver circuit
LD1, LD11 Light-emitting diode

The invention claimed is:

1. A laser drive circuit, comprising:

a first drive current unit configured to adjust, by a first MOSFET and a second MOSFET being connected in series, an inflow of a current to a light-emitting element that emits light in accordance with a current amount when the light-emitting element emits light and when the light-emitting element is extinguished;

a voltage drop unit configured to cause a gate-source voltage of the first MOSFET to drop when the light-emitting element is extinguished; and a timing generating unit configured to generate a signal for controlling driving of the first drive current unit and the voltage drop unit.

2. The laser drive circuit according to claim 1, wherein the voltage drop unit includes a third MOSFET that is provided between a source of the first MOSFET and a predetermined potential, and the timing generating unit is configured to output a signal for switching on the third MOSFET when extinguishing the light-emitting element.

3. The laser drive circuit according to claim 1, wherein the voltage drop unit includes:

a fourth MOSFET that is provided between a gate of the first MOSFET and a ground potential; and a switch that is provided between the gate of the first MOSFET and a predetermined potential, and the timing generating unit is configured to output a signal for switching on the fourth MOSFET and switching off the switch when extinguishing the light-emitting element.

4. The laser drive circuit according to claim 1, further comprising a second drive current unit which is provided in parallel to the first drive current unit and which is configured to control an inflow of a current to the light-emitting element when the light-emitting element emits light.

5. The laser drive circuit according to claim 1, wherein the first drive current unit and the voltage drop unit are provided on a cathode side of the light-emitting element.

6. A sensor apparatus, comprising:

a light-emitting element configured to emit light in accordance with a current amount;

a first drive current unit configured to adjust, by a first MOSFET and a second MOSFET being connected in series, an inflow of a current to the light-emitting element when the light-emitting element emits light and when the light-emitting element is extinguished;

a voltage drop unit configured to cause a gate-source voltage of the first MOSFET to drop when the light-emitting element is extinguished; and a timing generating unit configured to generate a signal for controlling driving of the first drive current unit and the voltage drop unit.

* * * * *